US012802768B2

(12) United States Patent
Lin et al.

(10) Patent No.: US 12,802,768 B2
(45) Date of Patent: Nov. 17, 2026

(54) MEMORY DEVICE AND OPERATION METHOD THEREOF

(71) Applicant: MACRONIX INTERNATIONAL CO., LTD., Hsinchu (TW)

(72) Inventors: Jia-Xing Lin, Hsinchu City (TW); Chin-Chu Chung, Hsinchu City (TW); Chien-Hsin Liu, Hsinchu City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 270 days.

(21) Appl. No.: 18/668,486

(22) Filed: May 20, 2024

(65) Prior Publication Data

US 2025/0356935 A1 Nov. 20, 2025

(51) Int. Cl.
*G11C 29/12* (2006.01)
*G11C 29/42* (2006.01)

(52) U.S. Cl.
CPC ........ *G11C 29/12005* (2013.01); *G11C 29/42* (2013.01)

(58) Field of Classification Search
CPC .............. G11C 29/12005; G11C 29/42; G11C 2029/0411; G11C 29/021; G11C 29/028; G11C 29/52; G11C 16/26; G11C 16/0483
USPC .......................................................... 714/719
See application file for complete search history.

(56) References Cited

U.S. PATENT DOCUMENTS

| | | | | |
|---|---|---|---|---|
| 9,437,315 | B2 * | 9/2016 | Lee | G11C 29/021 |
| 11,869,614 | B2 * | 1/2024 | Goode | G11C 16/3431 |
| 2020/0210259 | A1 | 7/2020 | Hoei | |
| 2020/0350023 | A1 | 11/2020 | Hong | |
| 2022/0093182 | A1 | 3/2022 | Kuribara | |
| 2022/0326884 | A1 * | 10/2022 | Kang | G06F 13/28 |

FOREIGN PATENT DOCUMENTS

| | | |
|---|---|---|
| CN | 113010347 A | 6/2021 |
| TW | I612525 B | 1/2018 |

* cited by examiner

*Primary Examiner* — James C Kerveros
(74) *Attorney, Agent, or Firm* — McClure, Qualey & Rodack, LLP

(57) ABSTRACT

An operation method for retrying reading data in a memory device provided by the present disclosure, comprises: applies a first read voltage to the memory device, and calculates a first absolute difference value between the numbers of a first bit value and a second bit value, corresponding to the first read voltage; applies a second read voltage to the memory device and calculates a second absolute difference value between the numbers of the first bit value and the second bit value, corresponding to the first read voltage; and compares the first absolute difference value and the second absolute difference value and determines the next retry read voltage based on the relation therebetween until the read data passing ECC decode.

20 Claims, 16 Drawing Sheets

500

501

| | $V_{RR1}$ | $V_{RR2}$ | $V_{RR3}$ | $V_{RR4}$ | $V_{Read}$ | $V_{RR5}$ | $V_{RR6}$ | $V_{RR7}$ | $V_{RR8}$ |
|---|---|---|---|---|---|---|---|---|---|
| 1# | 17512 | 18137 | 18432 | 18732 | 19357 | 19979 | 20802 | 21602 | 22387 |
| 0# | 19352 | 18727 | 18419 | 18132 | 17507 | 16885 | 16062 | 15262 | 14477 |
| (1#)-(0#) | -1840 | -590 | +13 | +600 | +1850 | +3094 | +4740 | +6340 | +7910 |

502

600

601

602

| | $V_{RR1}$ | $V_{RR2}$ | $V_{RR3}$ | $V_{RR4}$ | $V_{Read}$ | $V_{RR5}$ | $V_{RR6}$ | $V_{RR7}$ | $V_{RR8}$ |
|---|---|---|---|---|---|---|---|---|---|
| 1# | 17512 | 18137 | 18432 | 18732 | 19357 | 19979 | 20802 | 21602 | 22387 |
| 0# | 19352 | 18727 | 18419 | 18132 | 17507 | 16885 | 16062 | 15262 | 14477 |
| (1#)-(0#) | -1840 | -590 | +13 | +600 | +1850 | +3094 | +4740 | +6340 | +7910 |

800

Predefined retry read table 801

| Level | Retry Read Parameter |
|---|---|
| 0 | $HD_0$ |
| 1 | $HD_1$ |
| ... | ... |
| n-1 | $HD_{n-1}$ |
| n | $HD_n+SD11_n+SD12_n$ |
| n+1 | $HD_{n+1}+SD11_{n+1}+SD12_{n+1}$ |
| n+2 | $HD_{n+2}+SD11_{n+2}+SD12_{n+2}$ |
| ... | ... |
| n+x | $HD_{n+x}+SD11_{n+x}+SD12_{n+x}$ |

802

1200

1201

| Level | Retry Read Parameter | (1#)-(0#) |
|---|---|---|
| 1 | $V_{Read}$ | 1100 |
| 2 | $V_{RR1}$ | 800 |
| 3 | $V_{RR2}$ | 200 |
| 4 | $V_{RR3}$ | 700 |
| 4' | $V_{RR3}'$ | 100 |
| 5 | $V_{RR4}$ | 0 |

1300

1301

| Level | Retry Read Parameter | (1#)-(0#) |
|---|---|---|
| 1 | $V_{Read}$ | 1100 |
| 2 | $V_{RR1}$ | 800 |
| 3 | $V_{RR2}$ | 400 |
| 4 | $V_{RR3}$ | 500 |
| 5 | $V_{RR4}$ | 180 |

1500

1500b

| Level | Retry Read Parameter | (1#)-(0#) |
|---|---|---|
| 1 | $V_{RR1}$ | 3094 |
| 2 | $V_{RR2}$ | 600 |
| 3 | $V_{RR3}$ | 400 |
| 4 | $V_{RR4}$ | 380 |
| 5 | $V_{RR5}$ | 590 |

Minimum

Predefine retry read table 1501

| Level | Retry Read Parameter | Read Fail Module Result |
|---|---|---|
| 0 | $HD_0$ | $X_0$ |
| 1 | $HD_1$ | $X_1$ |
| ... | ... | ... |
| n-1 | $HD_{n-1}$ | $X_{n-1}$ |
| n | $HD_x+SD11_n+SD12_n$ | |

Determining $HD_x$ according to read fail module result

MEMORY DEVICE AND OPERATION METHOD THEREOF

The present disclosure is directed to semiconductor devices, e.g., operations for retrying reading data in semiconductor devices.

BACKGROUND

Semiconductor devices, e.g., NAND flash memory devices, after a certain retention period, the bit values of stored data may be deviation on the threshold voltage distribution, due to the physics features thereof, which the data read by original read voltage may not pass the ECC decode. Keeping retrying different read voltages for reading data that may pass ECC decode, which can suppress read performance and increase read latency.

SUMMARY

The invention is directed to methods, devices, systems and techniques for reducing the numbers of retrying reading in semiconductor devices, e.g., non-volatile memory devices such as NAND flash memory devices.

According to a first aspect of the present disclosure, an operation method for retrying reading data in a memory device is provided. The operation method comprises: applying a first read voltage to the memory device and calculating a first absolute difference between the number of a first bit value and the number of a second bit value, corresponding to the first read voltage; applying a second read voltage to the memory device and calculating a second absolute difference between the number of the first bit value and the number of the second bit value corresponding to the second read voltage, which a first voltage difference is between the second read voltage and the first read voltage along a first direction; and comparing the first absolute difference and the second absolute difference. Upon determining the second absolute difference is smaller than the first absolute difference, obtains at least one retry read voltages by subsequently adding an amount of the first voltage difference on the second read voltage along the first direction, and applies the at least one retry read voltages to the memory device until a read data obtained by one of the retry read voltages passing an ECC decoding. Upon determining the second absolute difference is greater than the first absolute difference, obtains at least one retry read voltages by subsequently subtracting the amount of the first voltage difference from the first read voltage along a second direction which is opposite to the first direction, and applies the at least one retry read voltages to the memory device until a read data obtained by one of the retry read voltages passing the ECC decoding.

In some embodiments, during obtaining the at least one retry read voltages by subsequently adding the amount of the first voltage difference on the second read voltage along the first direction, calculates at least two absolute differences between the number of the first bit value and the number of the second bit value obtained between the at least one retry read voltages. Upon determining the at least two absolute differences increase, a second voltage difference is sequentially subtracted from a precedent retry read voltage along the second direction until a read data obtained by one of the retry read voltages passing the ECC decoding. The second voltage difference is smaller than the first voltage difference.

In some embodiments, during obtaining the at least one retry read voltages by subsequently subtracting the amount of the first voltage difference from the first read voltage along the second direction, calculates at least two absolute differences between the number of the first bit value and the number of the second bit value obtained between the at least one retry read voltages. Upon determining the at least two absolute differences increase, a second voltage difference is sequentially added on a precedent retry read voltage along the first direction until a read data obtained by one of the retry read voltages passing the ECC decoding. The second voltage step is smaller than the first voltage.

In some embodiments, the second voltage difference is one third or one fourth of the first voltage difference.

In some embodiments, during obtaining the at least one retry read voltages by subsequently adding the amount of the first voltage difference on the second read voltage along the first direction, calculates slopes of respective absolute differences between the number of the first bit value and the number of the second bit value obtained between the retry read voltages. Upon determining the slopes of the respective absolute differences decrease, a third voltage difference is sequentially added on a precedent retry read voltage along the first direction for reading the memory device. Upon determining the slopes of the respective absolute differences increase, a fourth voltage difference is sequentially added on a precedent retry read voltage along the first direction for reading the memory device. The third voltage difference is greater than the first voltage, and the fourth voltage difference is smaller than the first voltage difference.

In some embodiments, during obtaining the at least one retry read voltages by subsequently subtracting the amount of the first voltage difference from the first read voltage along the second direction, calculates slopes of respective absolute differences between the number of the first bit value and the number of the second bit value obtained between the retry read voltages. Upon determining the slopes of the respective absolute differences decrease, a third voltage difference is sequentially subtracted from a precedent retry read voltage along the second direction for reading the memory device. Upon determining the slopes of the respective absolute differences increase, a fourth voltage difference is sequentially subtracted from a precedent retry read voltage along the first direction for reading the memory device. The third voltage difference is greater than the first voltage, and the fourth voltage difference is smaller than the first voltage difference.

In some embodiments, an absolute voltage difference between the first voltage difference and the third voltage difference or the fourth voltage difference is corresponding to the variation of the slopes of the respective absolute differences.

According to a second aspect of the present disclosure, an operation method for retrying reading data in a memory device is provided. The operation method comprises: executing a read operation to read the memory device, the read comprises the following steps: applying a first HD (hard decode) read voltage to the memory device and calculating a first absolute difference between the number of a first bit value and the number of a second bit value corresponding to the first HD read voltage; applying a second HD read voltage to the memory device and calculating a second absolute difference between the number of the first bit value and the number of the second bit value corresponding to the second HD read voltage, which a first voltage difference is between the second HD read voltage and the first HD read voltage along a first direction; and comparing the first absolute difference and the second absolute difference. Upon determining the second absolute difference is smaller than the first absolute difference, obtains at least one HD read voltages by subsequently adding an amount of the first voltage difference on the second HD voltage along the first direction, and applies the at least one HD read voltages to the memory device for the read operation based on preset levels. Upon determining the second absolute difference is greater than the first absolute difference, obtains at least one HD read voltages by subsequently subtracting the amount of the first voltage difference from the first HD voltage along a second direction which is opposite to the first direction, and applies the at least one HD read voltages to the memory device for the read operation based on the preset levels. Upon determining read data still fails to pass an ECC decode after completing the preset levels of the read operation, executes a SD (soft decode) operation for reading the memory device, the SD operation comprises the following steps: using a HD read voltage corresponding to the minimum absolute difference between the number of the first bit value and the number of the second bit value, among the at least one HD read voltages, as a first SD read voltage; generating a second SD read voltage and a third SD read voltage based on the first SD read voltage; calculating LLRs (Log-likelihood ration) based on the first SD read voltage, the second SD read voltage and the third SD read voltage, and executing soft decoding; and repeating the steps of the SD operation until the read data passing the ECC decode.

In some embodiments, during obtaining the at least one HD read voltages by subsequently adding the amount of the first voltage difference on the second HD voltage along the first direction for the read operation based on the preset levels, calculates at least two absolute differences between the number of the first bit value and the number of the second bit value obtained between the at least one HD read voltages. Upon determining the at least two absolute differences increase, a second voltage difference is sequentially subtracted from a precedent HD read voltage along the second direction for reading the memory device. The second voltage difference is smaller than the first voltage difference.

In some embodiments, during obtaining the at least one HD read voltages by subsequently subtracting the amount of the first voltage difference from the first HD voltage along a second direction for the read operation based on the preset levels, calculates at least two absolute differences between the number of the first bit value and the number of the second bit value obtained between the at least one HD read voltages. Upon determining the at least two absolute differences increase, a second voltage difference is sequentially added on a precedent HD read voltage along the first direction for reading the memory device. The second voltage step is smaller than the first voltage.

In some embodiments, the second voltage difference is one third or one fourth of the first voltage difference.

In some embodiments, during obtaining the at least one HD read voltages by subsequently adding the amount of the first voltage difference on the second HD voltage along the first direction for the read operation based on the preset levels, calculates slopes of respective absolute differences between the number of the first bit value and the number of the second bit value obtained between the at least one HD read voltages. Upon determining the slopes of the respective absolute differences decrease, a third voltage difference is sequentially added on a precedent HD read voltage along the first direction for reading the memory device. Upon determining the slopes of the respective absolute differences increase, a fourth voltage difference is sequentially added on a precedent HD read voltage along the first direction for reading the memory device. The third voltage difference is greater than the first voltage, and the fourth voltage difference is smaller than the first voltage difference.

In some embodiments, during obtaining the at least one HD read voltages by subsequently subtracting the amount of the first voltage difference from the first HD voltage along a second direction for the read operation based on the preset levels, calculates slopes of respective absolute differences between the number of the first bit value and the number of the second bit value obtained between the at least one HD read voltages. Upon determining the slopes of the respective absolute differences decrease, a third voltage difference is sequentially subtracted from a precedent HD read voltage along the second direction for reading the memory device. Upon determining the slopes of the respective absolute differences increase, a fourth voltage difference is sequentially subtracted from a precedent HD read voltage along the first direction for reading the memory device. The third voltage difference is greater than the first voltage, and the fourth voltage difference is smaller than the first voltage difference.

In some embodiments, an absolute voltage difference between the first voltage difference and the third voltage difference or the fourth voltage difference is corresponding to the variation of the slopes of the respective absolute differences.

According to a third aspect of the present disclosure, a memory device is provided, which comprises: a memory array; and a controller, coupled to the memory array. The controller comprises: a CPU; an ECC (error correction code) module, coupled to the CPU; and a read fail module, coupled to the CPU and the ECC module. The controller executes a read operation for reading the memory device, which comprises the following procedures: the controller applies a first HD (hard decode) read voltage to the memory array for reading data, and the read fail module calculates a first absolute difference between the number of a first bit value and the number of a second bit value corresponding to the first HD read voltage while the read data failing to pass an ECC decode of the ECC module; the controller applies a second HD read voltage to the memory array, and the read fail module calculates a second absolute difference between the number of the first bit value and the number of the second bit value corresponding to the second HD read voltage while the read data failing to pass the ECC decode of the ECC module, which a first voltage difference is between the second HD read voltage and the first HD read voltage along a first direction; and the CPU compares the first absolute difference and the second absolute difference. Upon determining the second absolute difference is smaller than the first absolute difference, the first voltage difference is sequentially added on the second HD read voltage by the controller, to respectively generate at least one HD read voltages along the first direction for the read operation for reading the memory array based on preset levels, until the read data passing the ECC decode of the ECC module. Upon determining the second absolute difference is greater than the first absolute difference, the first voltage difference is sequentially subtracted from the first HD read voltage by the controller, to respectively generate at least one HD read voltages along a second direction which is opposite to the first direction, for reading the memory array based on the preset levels, until the read data passing the ECC decode of the ECC module.

In some embodiments, upon determining read data still fails to pass the ECC decode of the ECC module after completing the preset levels of the read operation, the controller executes a SD (soft decode) operation for reading the memory array, the SD operation comprising the following procedures: the CPU using a HD read voltage corresponding to the minimum absolute difference between the number of the first bit value and the number of the second bit value, among the at least one HD read voltages recorded by the read fail module, as a first SD read voltage; the CPU generating a second SD read voltage and a third SD read voltage based on the first SD read voltage; the ECC module calculating LLRs (Log-likelihood ration) based on the first SD read voltage, the second SD read voltage and the third SD read voltage, and executing soft decoding; and the controller repeating the procedures of the SD operation until the read data passing the ECC decode.

In some embodiments, during the first voltage difference sequentially added on the second HD read voltage along the first direction by the controller, for reading the memory array based on the preset levels, the read fail module calculates at least two absolute differences between the number of the first bit value and the number of the second bit value obtained between the at least one HD read voltages. Upon determining the at least two absolute differences increase, a second voltage difference is sequentially subtracted from a precedent HD read voltage along the second direction by the controller for reading the memory array. The second voltage difference is smaller than the first voltage difference.

In some embodiments, during the first voltage difference sequentially subtracted from the first HD read voltage along the second direction by the controller, for reading the memory array based on the preset levels, the read fail module calculates at least two absolute differences between the number of the first bit value and the number of the second bit value obtained between the at least one HD read voltages. Upon determining the at least two absolute differences increase, a second voltage difference is sequentially added on a precedent HD read voltage along the first direction by the controller for reading the memory array. The second voltage step is smaller than the first voltage.

In some embodiments, during the first voltage difference sequentially added on the second HD read voltage along the first direction by the controller, for reading the memory array based on the preset levels, the read fail module calculates slopes of respective absolute differences between the number of the first bit value and the number of the second bit value obtained between the at least one HD read voltages. Upon determining the slopes of the respective absolute differences decrease, a third voltage difference is sequentially added on a precedent HD read voltage along the first direction by the controller for reading the memory array. Upon determining the slopes of the respective absolute differences increase, a fourth voltage difference is sequentially added on a precedent HD read voltage along the first direction by the controller for reading the memory array. The third voltage difference is greater than the first voltage, and the fourth voltage difference is smaller than the first voltage difference, and wherein an absolute voltage difference between the first voltage difference and the third voltage difference or the fourth voltage difference is corresponding to the variation of the slopes of the respective absolute differences.

In some embodiments, during the first voltage difference sequentially subtracted from the first HD read voltage along the second direction by the controller for reading the memory array based on the preset levels, the read fail module calculates slopes of respective absolute differences between the number of the first bit value and the number of the second bit value obtained between the at least one HD read voltages. Upon determining the slopes of the respective absolute differences between the number of the first bit value and the number of the second bit value obtained between the HD read voltages decrease, a third voltage difference is sequentially subtracted from a precedent HD read voltage along the second direction by the controller for reading the memory array. Upon determining the slopes of the respective absolute differences between the number of the first bit value and the number of the second bit value obtained between the HD read voltages increase, a fourth voltage difference is sequentially subtracted from a precedent HD read voltage along the first direction by the controller for reading the memory array. The third voltage difference is greater than the first voltage, and the fourth voltage difference is smaller than the first voltage difference, and wherein an absolute voltage difference between the first voltage difference and the third voltage difference or the fourth voltage difference is corresponding to the variation of the slopes of the respective absolute differences.

Embodiments of the above techniques include methods, systems, circuits, computer program products and computer-readable media. In one example, a method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described action The above and other aspects of the invention will become better understood with regard to the following detailed description of the preferred but non-limiting embodiment(s). The following description is made with reference to the accompanying drawings.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Embodiments of the present disclosure provide techniques for retrying reading data in semiconductor devices, e.g., non-volatile memory devices such as NAND flash memory devices. The techniques can ensure decreasing numbers (or levels) of retry read operation in the memory devices. Instead, the techniques enable memory devices to decrease numbers (or levels) of retry read operation by determining the direction of the lower or the lowest EBC (error bit count), such that the read data can pass the ECC decode, and the probability of the error bit of data being corrected is improving to achieve higher performance of read operation.

For example, multiple absolute differences between a first bit value and a second bit value obtained during multiple failures of data reading, are compared, and the next read voltage is determined based on the relation therebetween, such that the read data can pass ECC decode, instead of using predefined read retry voltages for repeatedly reading, to decrease the numbers (or levels) of retry read operation and improve the probability of the read data passing the ECC decode.

The techniques can be applied to various types of semiconductor devices, e.g., non-volatile memory devices such as NAND flash memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others. For illustration purposes, in the present disclosure, a memory device is described as an example of a semiconductor device.

Figure 1:
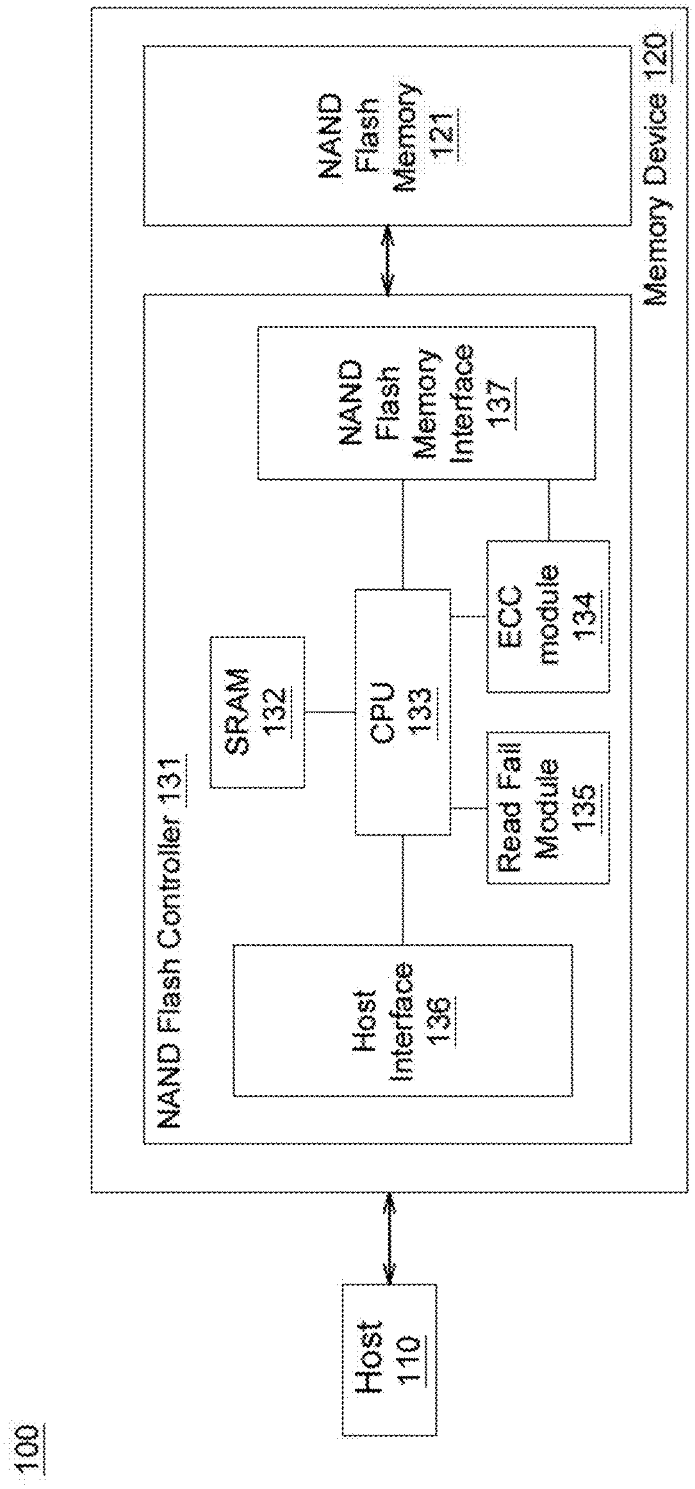
FIG. 1 is a schematic diagram illustrating an example of a system, according to one or more embodiments of the present disclosure.

FIG. 1 is a schematic diagram illustrating an example of a system 100, according to one or more embodiments of the present disclosure. The system 100 includes a host 110 and a memory device 120. The memory device 120 includes a NAND flash controller 131 and a NAND flash memory 121. The NAND flash controller 131 includes a host interface 131, a SRAM 132, a CPU 133, an ECC module 134, a read fail module 135 and a NAND flash memory interface 137. In some implementations, the NAND flash memory 121 can include a plurality of blocks that are coupled to the NAND flash controller 131. The NAND flash memory 121 can be a two-dimensional (2D) memory including 2D memory blocks. The NAND flash memory 121 can also be a three-dimensional (3D) memory including 3D memory blocks. The NAND flash memory 121 can be a semiconductor device formed on a semiconductor substrate (such as silicon wafer).

The host 110 can include at least one processor and at least one memory coupled to the at least one processor and storing programming instructions for execution by the at least one processor to perform one or more corresponding operations.

In some implementations, the memory device 120 is a storage device. For example, the memory device 120 can be an embedded multimedia card (eMMC), a secure digital (SD) card, a solid-state drive (SSD), or some other suitable storage. In some implementations, the memory device 120 is a client device that is coupled to the host 110 via the host interface 136.

The NAND flash controller 131 is a general-purpose microprocessor, or an application-specific microcontroller. In some implementations, the NAND flash controller 131 is a memory controller for the memory device 120. The following sections describe the various techniques based on implementations in which the NAND flash controller 131 is a memory controller. However, the techniques described in the following sections are also applicable in implementations in which the NAND flash controller 131 is another type of controller that is different from a memory controller.

The CPU 133 is configured to execute instructions and process data. The instructions include firmware instructions and/or other program instructions that are stored as firmware code and/or other program code, respectively, in the secondary memory. The data includes program data corresponding to the firmware and/or other programs executed by the CPU, among other suitable data. In some implementations, the CPU 133 is a general-purpose microprocessor, or an application-specific microcontroller.

The CPU 133 accesses instructions and data from the SRAM 132. For example, in some implementations, when the memory device 120 is an eMMC, an SD card or a smart watch, the SRAM 132 is configured as an internal memory of those devices.

In some implementations, the SRAM 132 is a cache memory that is included in the NAND flash controller 131, as shown in FIG. 1. The SRAM 132 stores instruction codes, which correspond to the instructions executed by the CPU 133, and/or the data that are requested by the CPU 133 during runtime. The NAND flash controller 131 transfers the instruction code and/or the data from the NAND flash memory 121 via the NAND flash memory interface 137 to the SRAM 132.

In some implementations, the NAND flash memory 121 is a non-volatile memory that is configured for long-term storage of instructions and/or data, or some other suitable non-volatile memory device. The NAND flash memory 121 can include one or more memory chips. Corresponding to the NAND flash memory 121 and the NAND flash controller 131, the memory device 120 is a flash memory device, e.g., a flash memory card. For example, in some implementations, when the memory device 120 is an eMMC or an SD card, the NAND flash memory 121 is configured as its memory. In some cases, the memory device 120 can include no device controller and the NAND flash memory 121 can directly communicate with the host 110.

The NAND flash memory 121 can include a cell array that can include a number of memory cells. The memory cells can be coupled in series to a number of row word lines and a number of column bit lines. Each memory cell can include a memory transistor configured as a storage element to store data. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory device 120 can include the NAND flash memory interface 137 and the host interface 136 as data I/O (input/output) circuit, which have multiple pins configured to be coupled to an external device. The pins can include SI/SIO0 for serial data input/serial data input & output, SO/SIO1 for serial data output/serial data input & output, SIO2 for serial data input or output, SIO3 for serial data input or output, RESET # for hardware reset pin active low, CS # for chip select, and R/B # pin for indicating a ready or busy status of the memory device 100. The data I/O circuit 150 can also include one or more other pins, e.g., WP # for write protection active low, and/or Hold # for a holding signal input.

In some implementations, during a write operation, the memory device 120 receives a write command (or a write instruction) via the NAND flash controller 131, e.g., according to an ONFI protocol, a SPI protocol or a QPI protocol. The write instruction can be transmitted using SDR or DDR. In some implementations, during the write operation, after the NAND flash controller 131 receiving user data via the host interface 136 from the host 110, the CPU 133 enables the ECC module 134 randomizing the distribution of bit values (such as bit values of "1" and "0") and then generating ECC parity. The foresaid pre-processed user data is then stored to the NAND flash memory 121 via the NAND flash memory interface 137. The further detailed description of ECC module 134 will refer to FIG. 2 as following.

Figure 2:
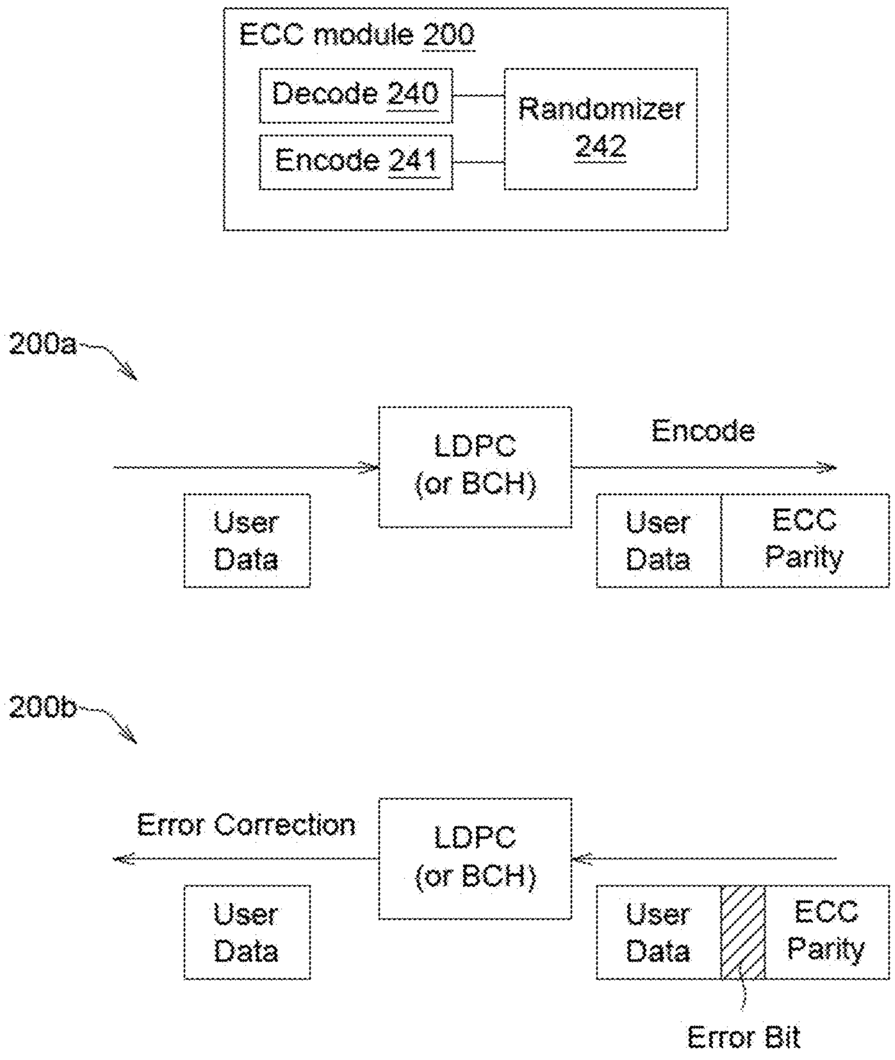
FIG. 2 is a schematic diagram illustrating encode and decode of an example of ECC module, according to one or more embodiments of the present disclosure.

FIG. 2 is a schematic diagram illustrating encode 200*a* and decode 200*b* of an example of ECC module 200, according to one or more embodiments of the present disclosure. The ECC module 200 is similar to the ECC module 134 of FIG. 1. The ECC module 200 is configured to executing functions of error correction code (ECC), which includes a decode 240, an encode 241 and a randomizer 242. The randomizer 242 is configure to randomize the distribution of the numbers of the bit values of the user data, which means that the distribution of the numbers of user data's 0 and 1 is more even as possible after randomizing by the randomizer 242 (such as the numbers of bit value 1 is generally equal to the numbers of bit value 0). As shown by encode 200*a*, after the user data encoded by the LDPC (low-density parity-check code) or BCH (Bose-Chaudhuri-Hocquenghem), the randomized user data and the ECC parity are generated and stored in the memory (such as the NAND flash memory 121 of FIG. 1). The stored user data will be decoded through the ECC decode according to ECC parity. As shown by decode 200*b*, during the ECC decode, the ECC module 200 will use LDPC or BCH to decode the read user data and the ECC parity (such as read from the NAND flash memory 121 of FIG. 1). When error bits occur in the read data, the ECC module 200 can execute error correction for the error bits according to the read user data and the ECC parity, to obtain the original user data. As above, the ECC encode and decode of ECC module 200 for the user data can protect the user data.

Referring back to FIG. 1, in some implementations, during the read operation, the memory device 120 receives a read command (or a read instruction) via the NAND flash controller 131, e.g., according to a SPI protocol or a QPI protocol. The read instruction can be transmitted using SDR or DDR. In some implementations, after the CPU 133 of the NAND flash controller 131 receiving the command (such as read command or read instruction), the NAND flash controller 131 can read user data via the NAND flash memory interface 137 from the NAND flash memory 121 and send to the ECC module 134 for ECC decoding (such as the decode 200*b* of FIG. 2). However, due to the features of NAND flash memory, the threshold voltage distribution of the stored user data in the NAND flash memory can be deviation, such that the read user data from the NAND flash memory 121 may not pass the ECC decode of the ECC module 134, which the read will fail. In the cases of read failing, the CPU 133 can control for using various predefined read voltages to repeatedly retry reading the user data in the NAND flash memory 121, until the read data from the NAND flash memory 121 can pass the ECC decode of the ECC module 134. The further detailed description of deviation and retry read of the threshold voltage distribution will refer to FIG. 3 as following.

Figure 3:
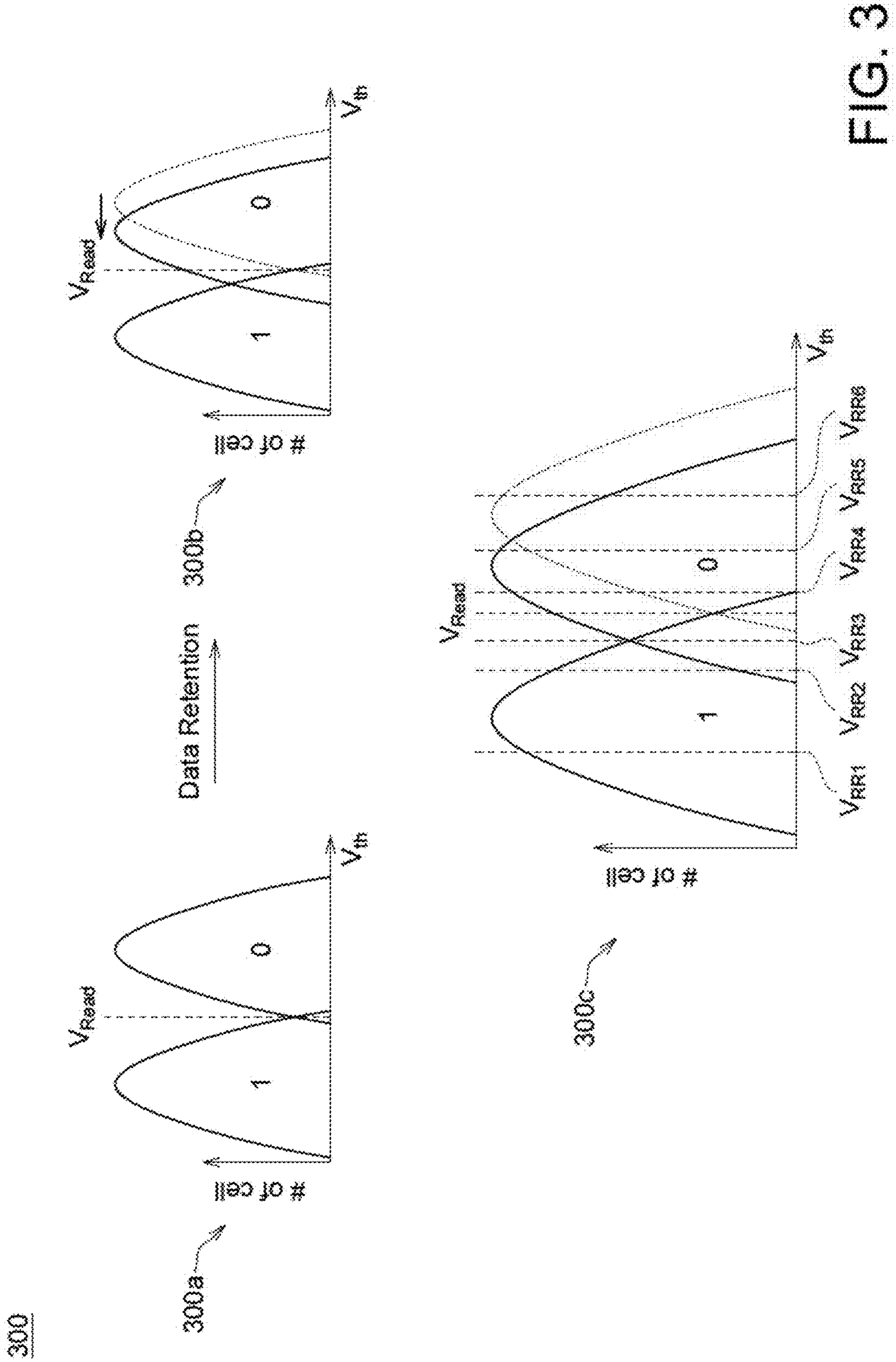
FIG. 3 is a schematic diagram illustrating the deviation and the read retry of the threshold voltage distribution of the user data, according to one or more embodiments of the present disclosure.

FIG. 3 is a schematic diagram illustrating the deviation and the read retry of the threshold voltage distribution 300 of the user data, according to one or more embodiments of the present disclosure. As above, due to the user data through ECC encoding before storing and randomized, as shown by the threshold voltage distribution graphic 300*a*, the read voltage $V_{Read}$ is located at the position where the number of cells of bit value 1 is generally equal to the number of cells of bit value 0, where also a "valley" as shown in the graphic. After certain period of data retention, due to the features of the NAND flash memory, the threshold distribution of user data may be deviation, as shown by the threshold voltage distribution graphic 300*b*, such as the range of threshold voltage of bit value 0 is moved. Therefore, the original read voltage $V_{Read}$ is no longer located at the position where the number of cells of bit value 1 is generally equal to the number of cells of bit value 0, where is not the "valley" as shown in the graphic. In the meantime, the read user data by the original read voltage $V_{Read}$ may not pass the ECC decode to correct the error bits, such that it will fail to read data.

As discussed above, in the cases of read failing, the CPU (such as the CPU 133 of the FIG. 1) can control for using various predefined read voltages to repeatedly retry reading the user data in the NAND flash memory (such as the NAND flash memory device 121 of FIG. 1), in order to find out the lower or the lowest EBC, as shown the threshold voltage distribution graphic 300*c*. For the example of the threshold voltage distribution graphic 300*c*, after read failing by the read voltage $V_{Read}$, various predefined retry read voltages, $V_{RR1}$, $V_{RR2}$, $V_{RR3}$, $V_{RR4}$, $V_{RR5}$ and $V_{RR6}$, are used for retrying reading. After retrying reading, the retry read voltage $V_{RR3}$ can be found at the position where the number of cells of bit value 1 is generally equal to the number of cells of bit value 0 (the difference between the number of cell of bit value 1 and the number of cell of bit value 0 is close to zero, which is the lower EBC), where is the "valley" as shown in the graphic. In the meantime, the read user data by the retry read voltage $V_{RR3}$ may pass the ECC decode, which it will success to read data. Such techniques for retrying reading can be also referred to multiple hard decode (HD) processes, and will be detailed descripted with the FIG. 4.

Figure 4:
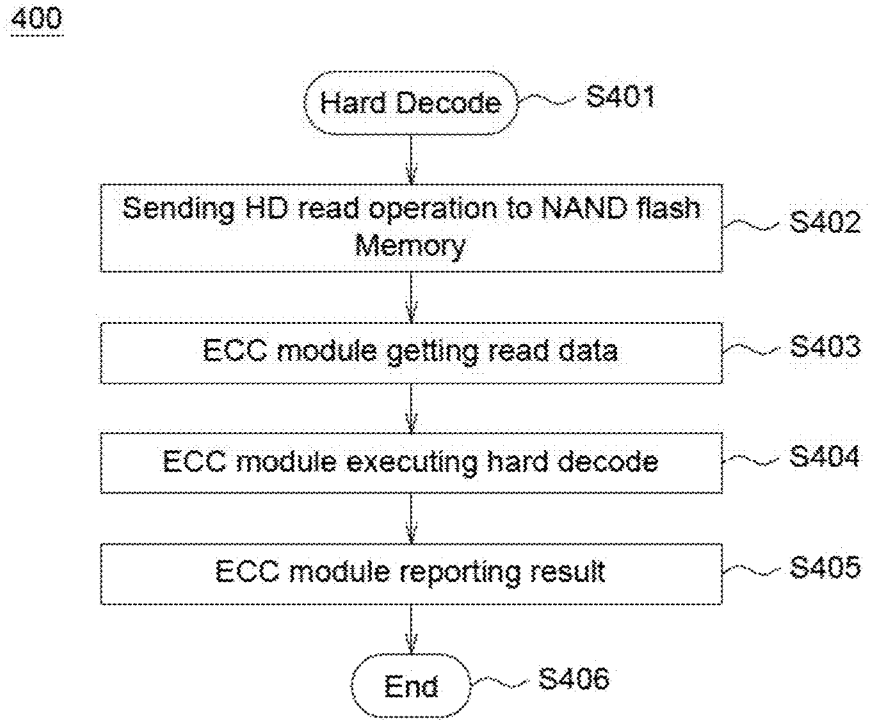
FIG. 4 is a flow chart of HD (hard decode) process for ECC (error correction code), according to one or more embodiments of the present disclosure.

FIG. 4 is a flow chart of HD (hard decode) process 400 for ECC (error correction code), according to one or more embodiments of the present disclosure. As shown in FIG. 4, after starting the S401 of the hard decode, in S402, HD read operation is sent to NAND flash Memory, such as the CPU 133 sends the HD read operation to the NAND flash memory 121, of FIG. 1. Then, in S403, the ECC module gets read data, such as the ECC module 134 obtains the read data from the NAND flash memory 121, of FIG. 1. After receiving the read data, in S404, the ECC module (such as the ECC module 134 of FIG. 1) executes hard decode and reports result as in S405, such as the ECC module 134 reports the result to the CPU 133, of FIG. 1. If the reported result indicates as success, which means that the read user data passes the ECC decode, the user data is read successfully. If the reported result indicates as failure, which means that the read user data does not pass the ECC decode and the user data is failure to be read, the read voltage can be changed (such as using various retry read voltage) for hard decode and the foresaid multiple HD processes can be repeated (such as using various predefined retry read voltages, $V_{RR1}$, $V_{RR2}$, $V_{RR3}$, $V_{RR4}$, $V_{RR5}$ and $V_{RR6}$, in the graphic 300*c* of FIG. 3) until finding out the read voltage which can successfully read the user data (Such as $V_{RR3}$ in the graphic 300*c* of FIG. 3).

Figure 5:
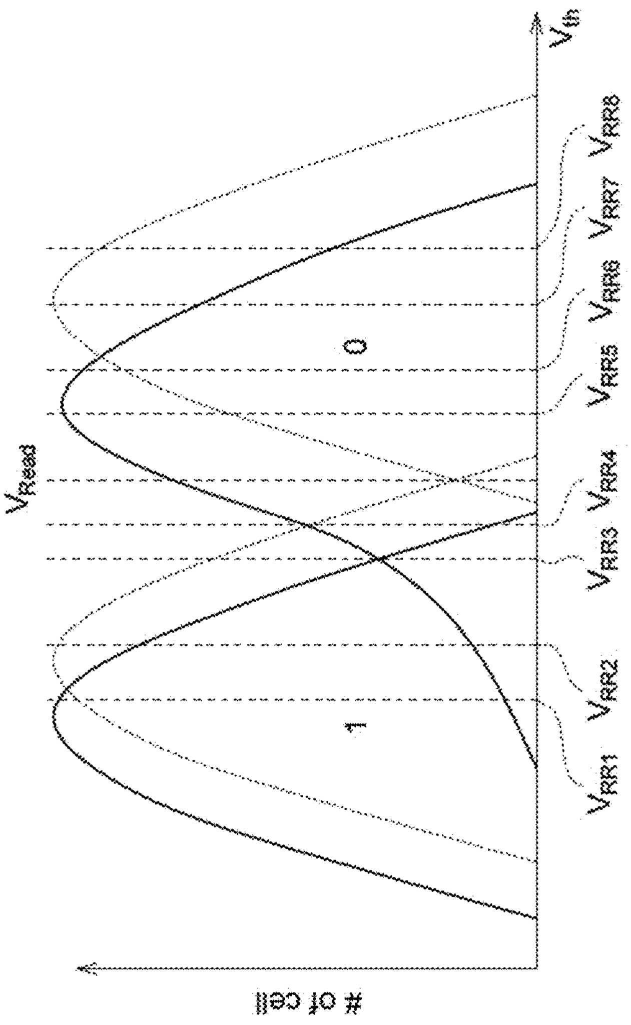
FIG. 5 is a schematic diagram illustrating the threshold voltage distribution of the user data, according to one or more embodiments of the present disclosure.
Figure 6:
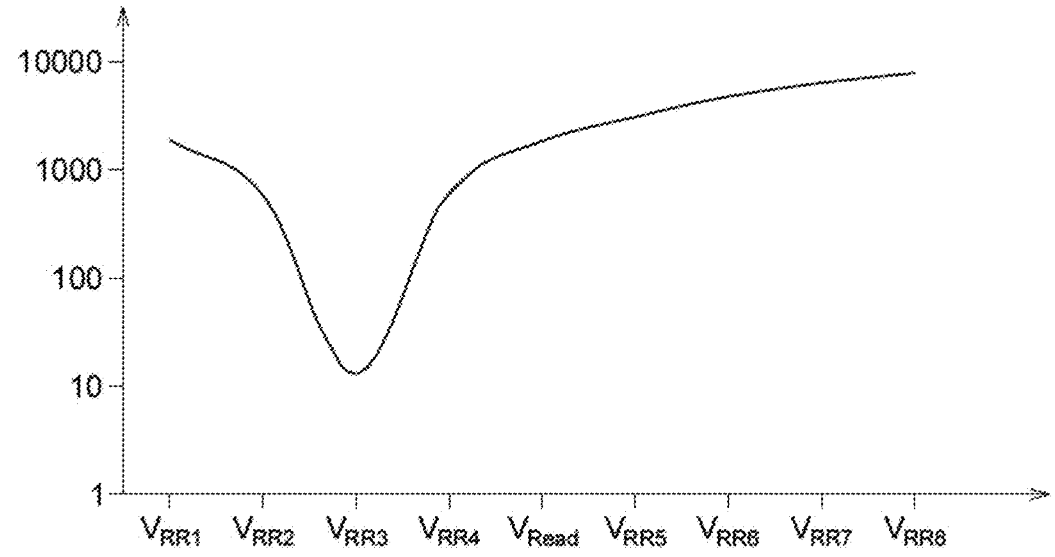
FIG. 6 is a schematic diagram illustrating the distribution of differences between the numbers of bit values of the user data, according to one or more embodiments of the present disclosure.

To detailed describe the retry read voltages of the hard decode, FIGS. 5 and 6 will be referred as following. FIGS. 5 and 6 are schematic diagrams illustrating the threshold voltage distribution 500 and the distribution 600 of differences between the numbers of bit values of the user data, respectively, according to one or more embodiments of the present disclosure. In FIG. 5, numbers of the cell of bit values 1 (1 #) and 0 (0 #) and the difference between the numbers ((1 #)−(0 #)) obtained by using various predefined retry read voltages, $V_{RR1}$, $V_{RR2}$, $V_{RR3}$, $V_{RR4}$, $V_{RR5}$, $V_{RR6}$, $V_{RR7}$ and $V_{RR8}$, for read operation, can be known according to the table 501 and the threshold voltage distribution graphic 502. Similarly with the example in FIG. 3, in the threshold voltage distribution graphic 502, due to the original read voltage $V_{Read}$ no longer at the position where the number of cells of bit value 1 (1 #) and bit value 0 (0 #) are equal (currently the difference between the numbers is +1850). After repeatedly using various retry read voltages (such as $V_{RR1}$, $V_{RR2}$, $V_{RR3}$, $V_{RR4}$, $V_{RR5}$, $V_{RR6}$, $V_{RR7}$ and $V_{RR8}$) for multiple hard decode processes, it can be find out that $V_{RR3}$ is at the position where the number of cells of bit value 1 (1 #) and bit value 0 (0 #) are generally equal (currently the difference between the numbers is +13, which is close to zero as a lower EBC), where is the “valley” as shown in the graphic. Thus, the retry read voltage $V_{RR3}$ can be used as a new read voltage to successfully read the user data.

Similarly, in FIG. 6, referring to the table 602 (identical to the table 501 in FIG. 5) and distribution graphic 601 of differences of numbers of bit values, the number of cells of bit value 1 (1 #) and bit value 0 (0 #) of the original read voltage $V_{Read}$ currently is +1850, which is not located at the position of the valley in the distribution graphic 601. The difference of the numbers between cells of bit value 1 (1 #) and bit value 0 (0 #) of the retry read voltage $V_{RR3}$ is the minimum (+13) and close to zero (the lower EBC), among the retry read voltages, which the retry read voltage $V_{RR3}$ is located at the valley as shown in the graphic. Thus, the retry read voltage $V_{RR3}$ can be used as a read voltage to successfully read the user data.

As illustrated by the examples above, the controller of memory device can control the ECC module (such as the ECC module 134 of FIG. 1 and the ECC module 200 of FIG. 2) to repeatedly execute multiple hard decode (as shown by FIGS. 3 to 6) processes while read failing, until the retry read voltage which can be used read user data passing the ECC decode, is found (such as the retry read voltage $V_{RR3}$ of FIGS. 3, 5 and 6). Such techniques of hard decode may need many times of retrying to successfully read (to obtain the lower EBC and pass the ECC decode), or it may still fail to read (cannot pass the ECC decode) after trying many times. In some implementations, the ECC module (such as the ECC module 134 of FIG. 1 and the ECC module 200 of FIG. 2) further provides the technique of soft decode (SD). The soft decode can be used as an alternative mean of ECC decode, when it still fails to read (cannot pass the ECC decode) after hard decode processes executing for a preset numbers (or levels).

Figure 7:
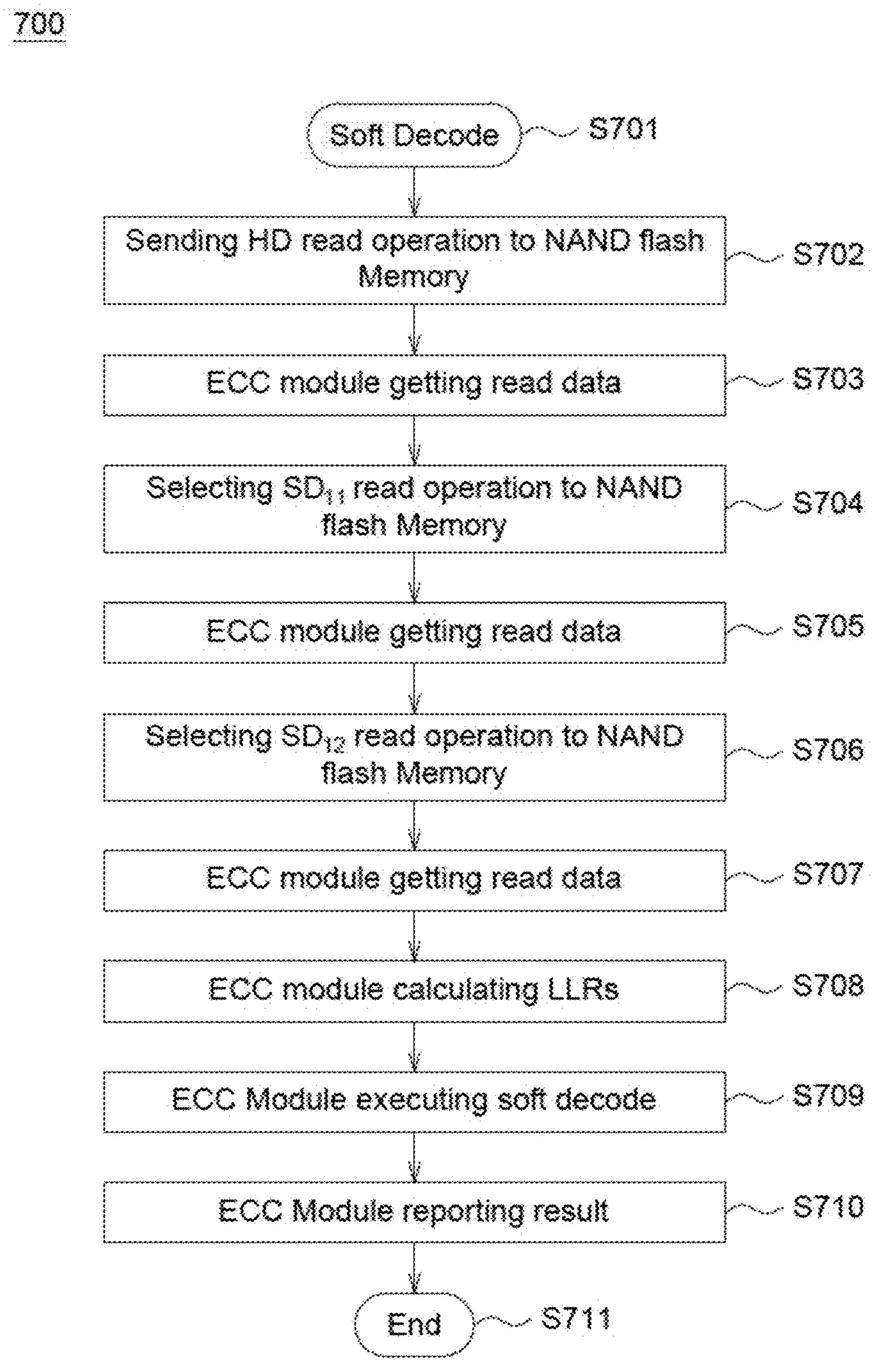
FIG. 7 is a flow chart of SD (soft decode) process for ECC, according to one or more embodiments of the present disclosure.
Figure 8:
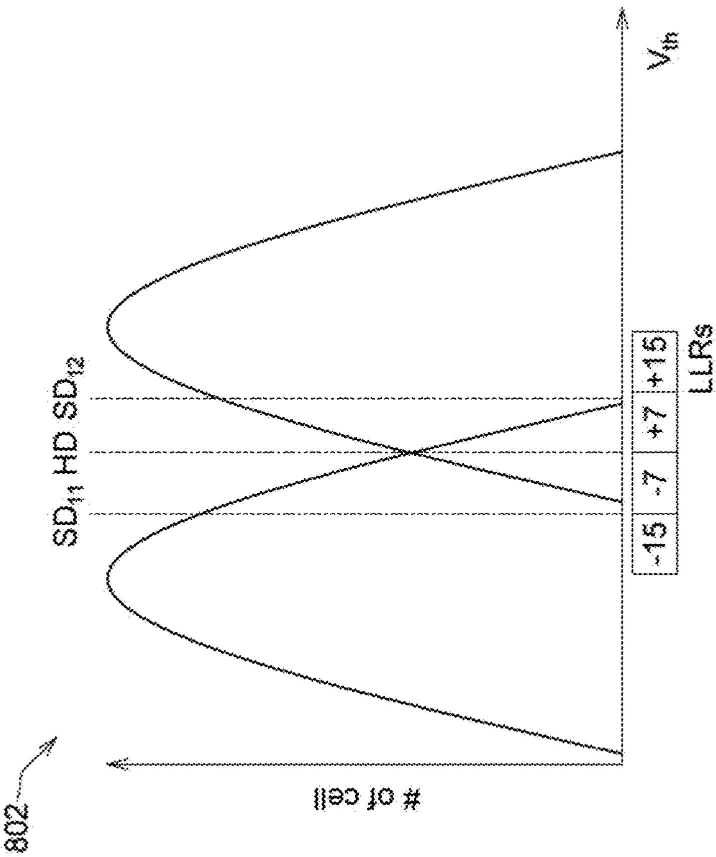
FIG. 8 is a schematic diagram illustrating the threshold voltage distribution of the user data applied with the SD process of FIG. 7, according to one or more embodiments of the present disclosure.

Referring to the FIGS. 7 and 8, FIG. 7 is a flow chart of SD (soft decode) process 700 for ECC, and FIG. 8 is a schematic diagram illustrating the threshold voltage distribution 800 of the user data applied with the SD process 700 of FIG. 7, according to one or more embodiments of the present disclosure. As shown in FIG. 7, after starting the S701 of the soft decode, in S702, HD read operation is sent to NAND flash Memory, such as the CPU 133 sends the HD read operation to the NAND flash memory 121, of FIG. 1, or the step S402 of FIG. 4. Then, in S703, the ECC module gets read data, such as the ECC module 134 obtains the read data from the NAND flash memory 121, of FIG. 1, or the step S403 of FIG. 4. When the read data obtained by the ECC module still fails to pass ECC decode, for example, after the specified numbers (level 0 to n−1) of HD operation, in S704, according to the predefined retry read table 801, the CPU (such as the CPU 133 of FIG. 1) can control ECC module (such as the ECC module 134 of FIG. 1) to select $SD_{11}$ (at level n) read operation to the NAND flash memory (such as the NAND flash memory 121 of FIG. 1), and the ECC module gets read data in S705. Similarly, in S706, according to the predefined retry read table 801, the CPU (such as the CPU 133 of FIG. 1) can control ECC module (such as the ECC module 134 of FIG. 1) to select $SD_{12}$ (also at level n) read operation to the NAND flash memory (such as the NAND flash memory 121 of FIG. 1), and the ECC module gets read data in S707. As shown in the predefined retry read table 801 and the threshold voltage distribution graphic 802, according to the predefined retry read parameter of $HD_n$, SD11$_n$ and SD12$_n$ (which is also referred to $HD_n$+SD11$_n$+SD12$_n$, which does not mean intending to summing these values) at level n, the LDPC (as shown in FIG. 2) of the ECC module can further calculate distributions of numbers of bit values corresponding to the $HD_n$+SD11$_n$+SD12$_n$ respectively, and build the soft data model of LLR (Log-likelihood ratio). In other words, ECC module calculates LLR (in S708) by the result of executing predefined $HD_n$+SD11$_n$+SD12$_n$, and executes soft decode for retrying reading the NAND flash memory (in S709). Since the soft decode calculates LLR according to the threshold voltage distribution, the probability of passing ECC decode is higher than that of the hard decode. Then in S710, the ECC module reports result of executing the soft decode. If the reported result indicates as success, which means that the read user data passes the ECC decode, the user data is read successfully. If the reported result indicates as failure, which means that the read user data does not pass the ECC decode and the user data is failure to be read, the soft decode can be executed according to the levels (such as n+1, n+2 . . . n+x)

of the predefined retry read table 801, and the foresaid process can be repeated (such as retrying using $HD_{n+1}$+$SD11_{n+1}$+$SD12_{n+1}$ at level n+1 to calculates LLR to read) until the user data is successfully read (pass the ECC decode). The soft decode operation needs at least three times of read ($HD_n$+$SD11_n$+$SD12_n$) according to the examples above.

Based on techniques of hard decode and soft decode for retrying reading NAND flash memory provided by examples and implementations above, techniques of hard decode and soft decode with read fail error handling are provided by the present disclosure, which can be also applied on NAND flash memory, to reduce the numbers of retry read and increase the speed of passing ECC decode for retrying reading. Instead of using predefined retry read voltages (such as retry read voltages, $V_{RR1}$, $V_{RR2}$, $V_{RR3}$, $V_{RR4}$, $V_{RR5}$, $V_{RR6}$, $V_{RR7}$ and $V_{RR8}$ of FIGS. 3 and 5), such read fail error handling can set new retry read voltages by the read fail module of the controller of the memory (such as the read fail module 135 of the NAND flash controller 131 of the memory device 120 of FIG. 1) according to the read report (fail) form the ECC module (such as the ECC module 134 of FIG. 1). Various implementations of techniques of hard decode and soft decode with read fail error handling according to the present disclosure will be described with further details below referring to FIGS. 9 to 15.

Figure 9:
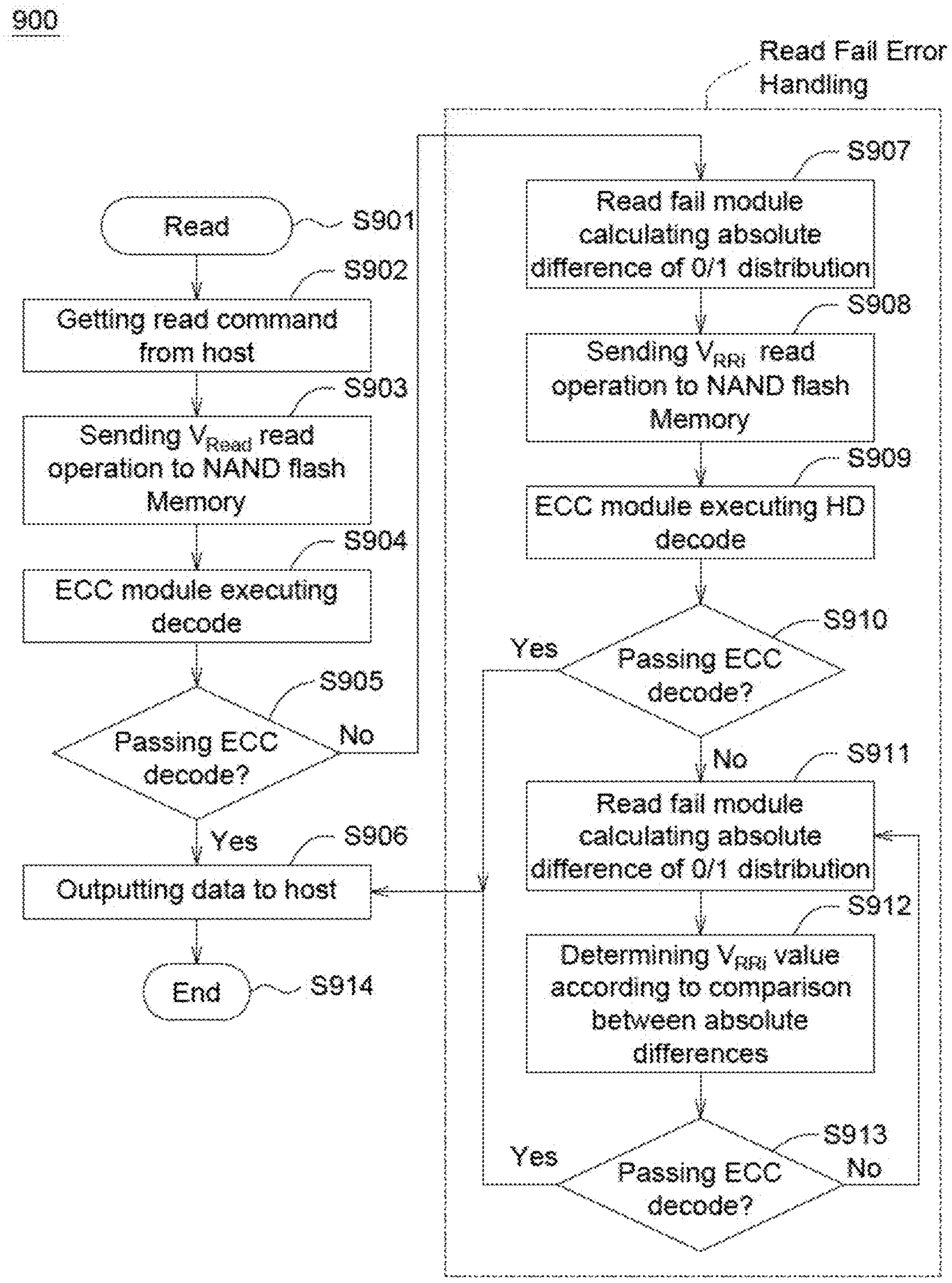
FIG. 9 is a flow chart of process of HD process with read fail error handling for ECC, according to one or more embodiments of the present disclosure.

FIG. 9 is a flow chart of process of HD process 900 with read fail error handling for ECC, according to one or more embodiments of the present disclosure. S901 to S904 of FIG. 9 are similar to S401 to S404 of FIG. 4, which the descriptions is omitted here. The difference with the HD process 400 of FIG. 4 is that, in S905 of HD process 900 of FIG. 9, determines that the user data read by read voltage $V_{Read}$ can pass ECC decode or not, then if yes, the user data is output to the host (S906); and if no, executes read fail error handling (S907 to S913).

Figure 10:
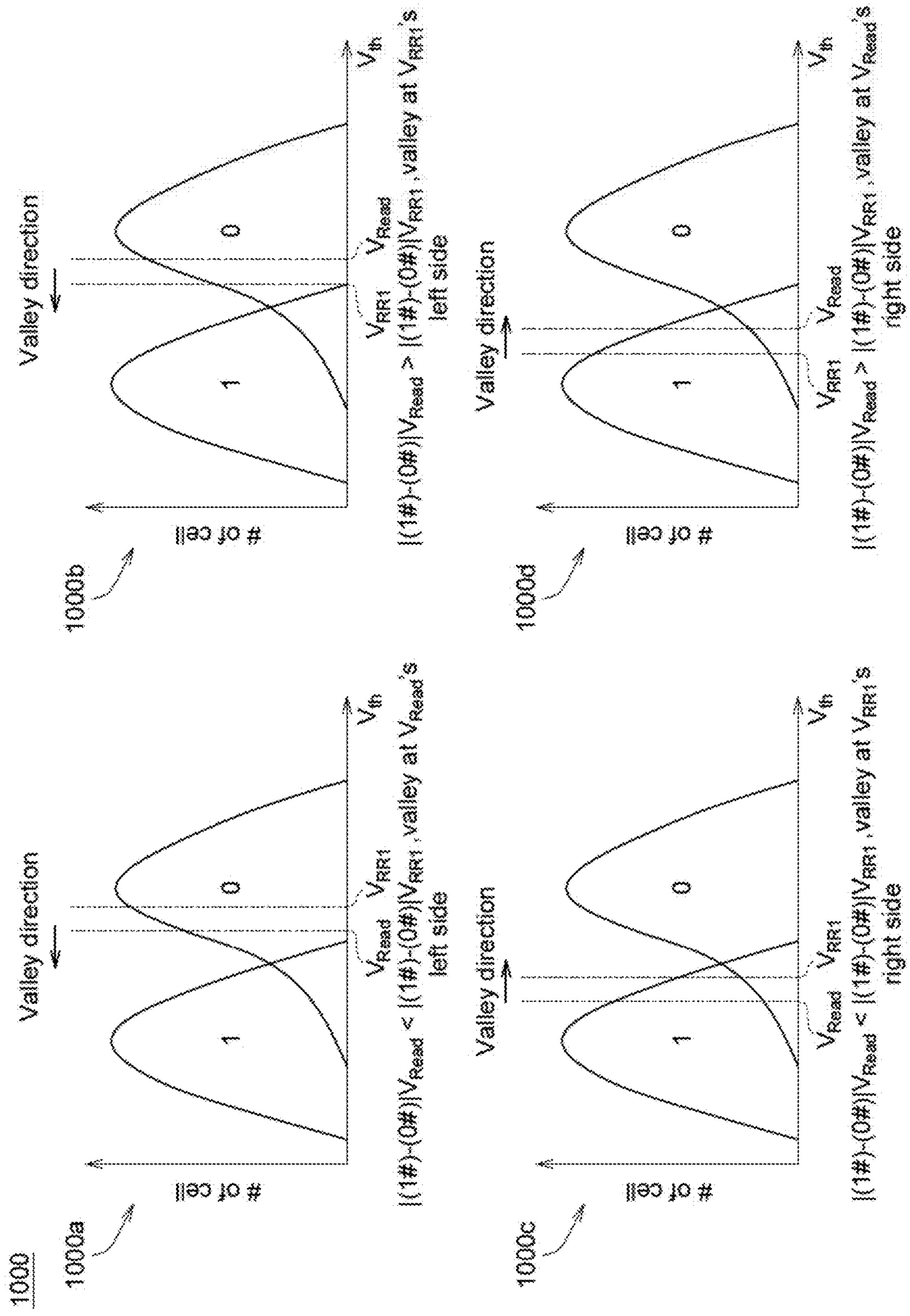
FIG. 10 is a schematic diagram illustrating the threshold voltage distribution of the user data applied with the HD process of FIG. 9, according to one or more embodiments of the present disclosure.

Also referring to FIG. 10, FIG. 10 is a schematic diagram illustrating the threshold voltage distribution 1000 of the user data applied with the HD process 900 of FIG. 9. When starts the read fail error handling, in S907, the read fail module (such as the read fail module 135 of FIG. 1) calculates absolute difference (|(1 #)−(0 #)|) of bit values 1/0 distribution, as shown as $|(1\ \#)-(0\ \#)|V_{Read}$ in FIG. 10. Then, the CPU (such as the CPU 133 of FIG. 1) sends $V_{RRi}$ read operation to the NAND flash Memory (S908). The retry read voltage $V_{RRi}$ can be set by adding predefined voltage difference ($V_{RRi}-V_{Read}$ as ΔV) on the read voltage $V_{Read}$. The retry read voltage $V_{RRi}$ in the examples of threshold voltage distribution graphics 1000*a* and 1000*c* is set as the retry read voltage $V_{RR1}$ is relatively on the right side of the read voltage $V_{Read}$ along the X-axis (represents the threshold voltage Vth), which means that the retry read voltage $V_{RR1}$ is greater than the read voltage $V_{Read}$. In this case, the voltage difference ΔV is positive in the first direction corresponding to the X-axis (from left to right). Contradictorily, the retry read voltage $V_{RRi}$ in the examples of threshold voltage distribution graphics 1000*b* and 1000*d* is set as the retry read voltage $V_{RR1}$ is relatively on the left side of the read voltage $V_{Read}$ along the X-axis (represents the threshold voltage Vth), which means that the retry read voltage $V_{RR1}$ is smaller than the read voltage $V_{Read}$. In this case, the voltage difference ΔV is negative corresponding to the first direction related to the X-axis (from left to right). Accordingly, based on the position of the X-axis that the retry read voltage $V_{RR1}$ (the retry read voltage $V_{RRi}$ of FIG. 9 can be referred to the first retry read voltage $V_{RR1}$ of FIG. 10) is set related to the read voltage $V_{Read}$, the voltage difference ΔV between both can be positive or negative (such as different cases in threshold voltage distribution graphics 1000*a* to 1000*d* of FIG. 10) corresponding to the first direction related to the X-axis (from left to right).

Then, in S909, ECC module executes hard decode based on the user data read by the retry read voltage $V_{RRi}$, and determines that the user data read by read voltage $V_{RRi}$ can pass ECC decode or not in S910. If yes, the user data is output to the host (S906). If no, similarly with S907, in S911, the read fail module (such as the read fail module 135 of FIG. 1) calculates absolute difference (|(1 #)−(0 #)|) of bit values 1/0 distribution corresponding to the retry read voltage $V_{RRi}$, as shown as $|(1\ \#)-(0\ \#)|V_{RR1}$ in FIG. 10. As following, in S912, the CPU determines the next retry read voltage $V_{RRi}$ value according to comparison between two precedent absolute differences (such as $|(1\ \#)-(0\ \#)|V_{RR1}$ and $|(1\ \#)-(0\ \#)|V_{Read}$ of FIG. 10), for the next retry read. The different cases of how to determine the next retry read voltage $V_{RRi}$ based on the comparison between two precedent absolute differences ($|(1\ \#)-(0\ \#)|V_{RR1}$ and $|(1\ \#)-(0\ \#)|V_{Read}$) in threshold voltage distribution graphics 1000*a* to 1000*d* of FIG. 10 will be described with further details below.

In the case of the threshold voltage distribution graphic 1000*a* (the voltage difference ΔV is positive in the first direction), since the absolute difference of bit values 1/0 distribution corresponding to $V_{Read}$, $|(1\ \#)-(0\ \#)|V_{Read}$, is smaller than the absolute difference of bit values 1/0 distribution corresponding to $V_{RR1}$, $|(1\ \#)-(0\ \#)|V_{RR1}$, it means that the EBC corresponding to $V_{RR1}$ is greater than the EBC of $V_{Read}$. Accordingly, the direction of the lower EBC corresponding to the position of "valley" of the graphic is contradicted to the first direction that the voltage difference ΔV is added on $V_{Read}$ to obtain $V_{RR1}$ on the X-axis, which means that the lower EBC is located on the left side of $V_{Read}$ (can be referred as the second direction related to X-axis (from right to left)). Thus, to search retry read voltage $V_{RRi}$ corresponding to the lower EBC, the next retry read voltage $V_{RRi}$ can be obtained by subtracting (the second direction opposite the first direction) the predefined voltage difference ΔV (positive) from the read voltage $V_{Read}$ on the X-axis. Since the voltage difference ΔV is positive in the case of the threshold voltage distribution graphic 1000*a*, subtracting (the second direction opposite the first direction) the predefined voltage difference ΔV (positive) from the read voltage $V_{Read}$ on the X-axis is substantially decreasing voltage of the read voltage $V_{Read}$, such that the next retry read voltage $V_{RRi}$ will be on the left side of the read voltage $V_{Read}$ (not shown).

In the case of the threshold voltage distribution graphic 1000*c* (the voltage difference ΔV is positive in the first direction), since the absolute difference of bit values 1/0 distribution corresponding to $V_{Read}$, $|(1\ \#)-(0\ \#)|\ V_{Read}$, is greater than the absolute difference of bit values 1/0 distribution corresponding to $V_{RR1}$, $|(1\ \#)-(0\ \#)|V_{RR1}$, it means that the EBC corresponding to $V_{RR1}$ is smaller than the EBC of $V_{Read}$. Accordingly, the direction of the lower EBC corresponding to the position of "valley" of the graphic is same to the first direction that the voltage difference ΔV is added on $V_{Read}$ to obtain $V_{RR1}$ on the X-axis, which means that the lower EBC is located on the right side of $V_{RR1}$. Thus, to search retry read voltage $V_{RRi}$ corresponding to the lower EBC, the next retry read voltage $V_{RRi}$ can be obtained by adding (also in the first direction) the predefined voltage difference ΔV (positive) on the precedent retry read voltage $V_{RRi}$ on the X-axis. Since the voltage difference ΔV is positive in the case of the threshold voltage distribution graphic 1000*c*, adding (in the first direction) the predefined voltage difference ΔV (positive) on the precedent retry read voltage $V_{RRi}$ on the X-axis is substantially increasing voltage of the precedent retry read voltage $V_{RRi}$, such that the next retry read voltage $V_{RRi}$ will be on the right side of the precedent retry read voltage $V_{RRi}$ (not shown).

In the case of the threshold voltage distribution graphic 1000*b* (the voltage difference ΔV is negative in the first direction), since the absolute difference of bit values 1/0 distribution corresponding to $V_{Read}$, |(1 #)−(0 #)| $V_{Read}$, is greater than the absolute difference of bit values 1/0 distribution corresponding to $V_{RR1}$, |(1 #)−(0 #)|$V_{RR1}$, it means that the EBC corresponding to $V_{RR1}$ is smaller than the EBC of $V_{Read}$. Accordingly, the direction of the lower EBC corresponding to the position of "valley" of the graphic is same to the first direction that the voltage difference ΔV (negative) is added on $V_{Read}$ to obtain $V_{RR1}$ on the X-axis, which means that the lower EBC is located on the left side of $V_{RR1}$. Thus, to search retry read voltage $V_{RRi}$ corresponding to the lower EBC, the next retry read voltage $V_{RRi}$ can be obtained by adding (also in the first direction) the predefined voltage difference ΔV (negative) on the precedent retry read voltage $V_{RRi}$ on the X-axis. Since the voltage difference ΔV is negative in the case of the threshold voltage distribution graphic 1000*b*, adding (in the first direction) the predefined voltage difference ΔV (negative) on the precedent retry read voltage $V_{RRi}$ on the X-axis is substantially decreasing voltage of the precedent retry read voltage $V_{RRi}$, such that the next retry read voltage $V_{RRi}$ will be on the left side of the precedent retry read voltage $V_{RRi}$ (not shown).

In the case of the threshold voltage distribution graphic 1000*d* (the voltage difference ΔV is negative in the first direction), since the absolute difference of bit values 1/0 distribution corresponding to $V_{Read}$, |(1 #)−(0 #)| $V_{Read}$, is greater than the absolute difference of bit values 1/0 distribution corresponding to $V_{RR1}$, |(1 #)−(0 #)|$V_{RR1}$, it means that the EBC corresponding to $V_{RR1}$ is smaller than the EBC of $V_{Read}$. Accordingly, the direction of the lower EBC corresponding to the position of "valley" of the graphic is contradicted to the first direction that the voltage difference ΔV (negative) is added on $V_{Read}$ to obtain $V_{RR1}$ on the X-axis, which means that the lower EBC is located on the right side of $V_{Read}$ (can be referred as the second direction since ΔV is negative). Thus, to search retry read voltage $V_{RRi}$ corresponding to the lower EBC, the next retry read voltage $V_{RRi}$ can be obtained by subtracting (the second direction opposite the first direction) the predefined voltage difference ΔV (negative) from the read voltage $V_{Read}$ on the X-axis. Since the voltage difference ΔV is negative in the case of the threshold voltage distribution graphic 1000*d*, subtracting (the second direction opposite the first direction) the predefined voltage difference ΔV (negative) from the read voltage $V_{Read}$ on the X-axis is substantially increasing voltage of the read voltage $V_{Read}$, such that the next retry read voltage $V_{RRi}$ will be on the right side of the read voltage $V_{Read}$ (not shown).

Therefore, it can be understood that, in examples of threshold voltage distribution graphics 1000*a* to 1000*d* above, the technique provided by the present disclosure can determine the next retry read voltage $V_{RRi}$ based on the comparison of absolute differences between two precedent read voltages, and in S913, can determine that the read user data read passes ECC decode or not. Those steps (S911-S913) can be executed repeatedly until finding the retry read voltage for passing the ECC decode, and the read data can be output to the host (S906).

The technique of determining direction setting of $V_{RRi}$ and adjustment of voltage difference ΔV according to the embodiments of the present disclosure, will be described with further details below referring to FIGS. 11A to 13.

Figure 11A:
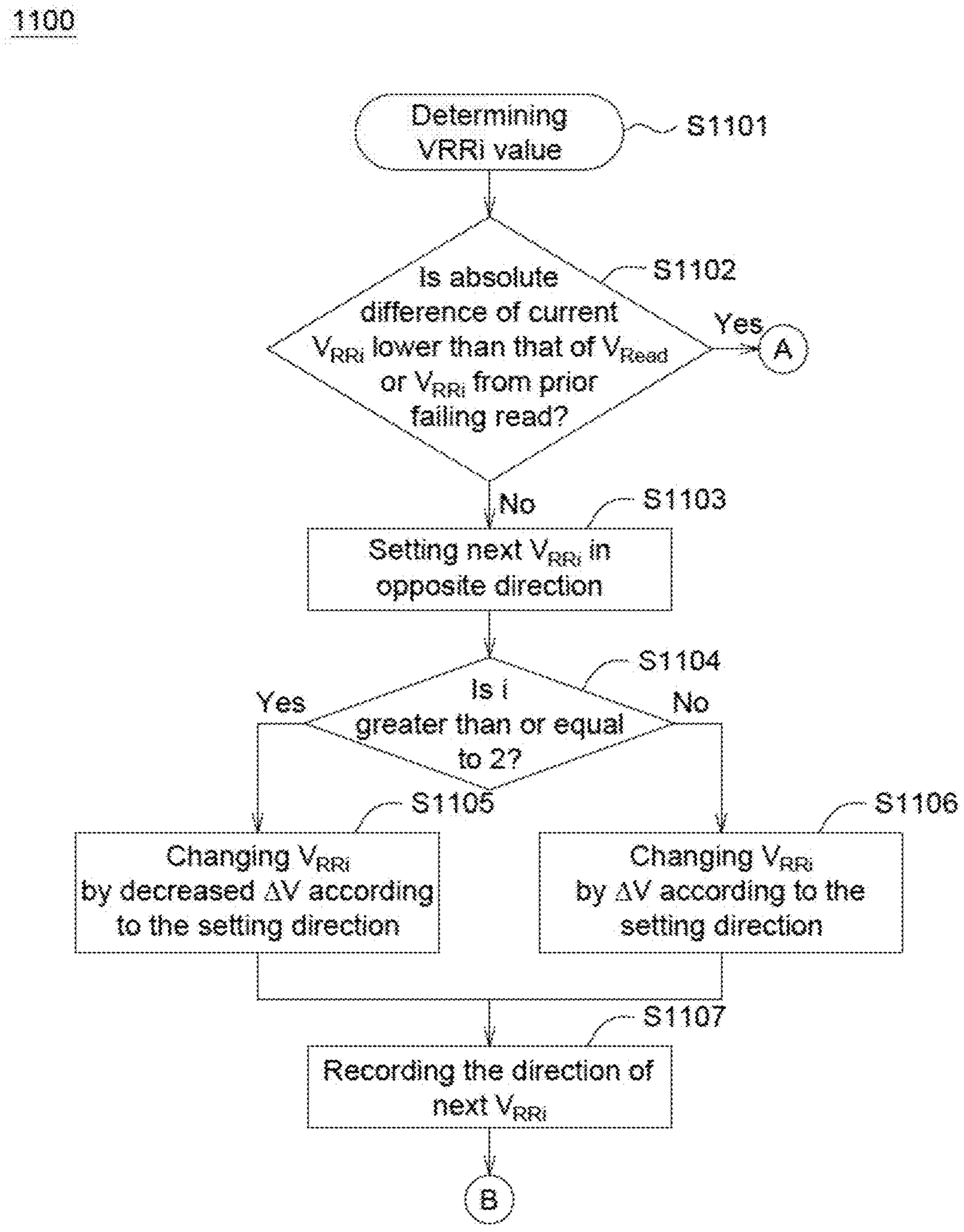
FIGS. 11A and 11B are flow charts of process of setting retry read voltage with read fail error handling for ECC, according to one or more embodiments of the present disclosure.
Figure 11B:
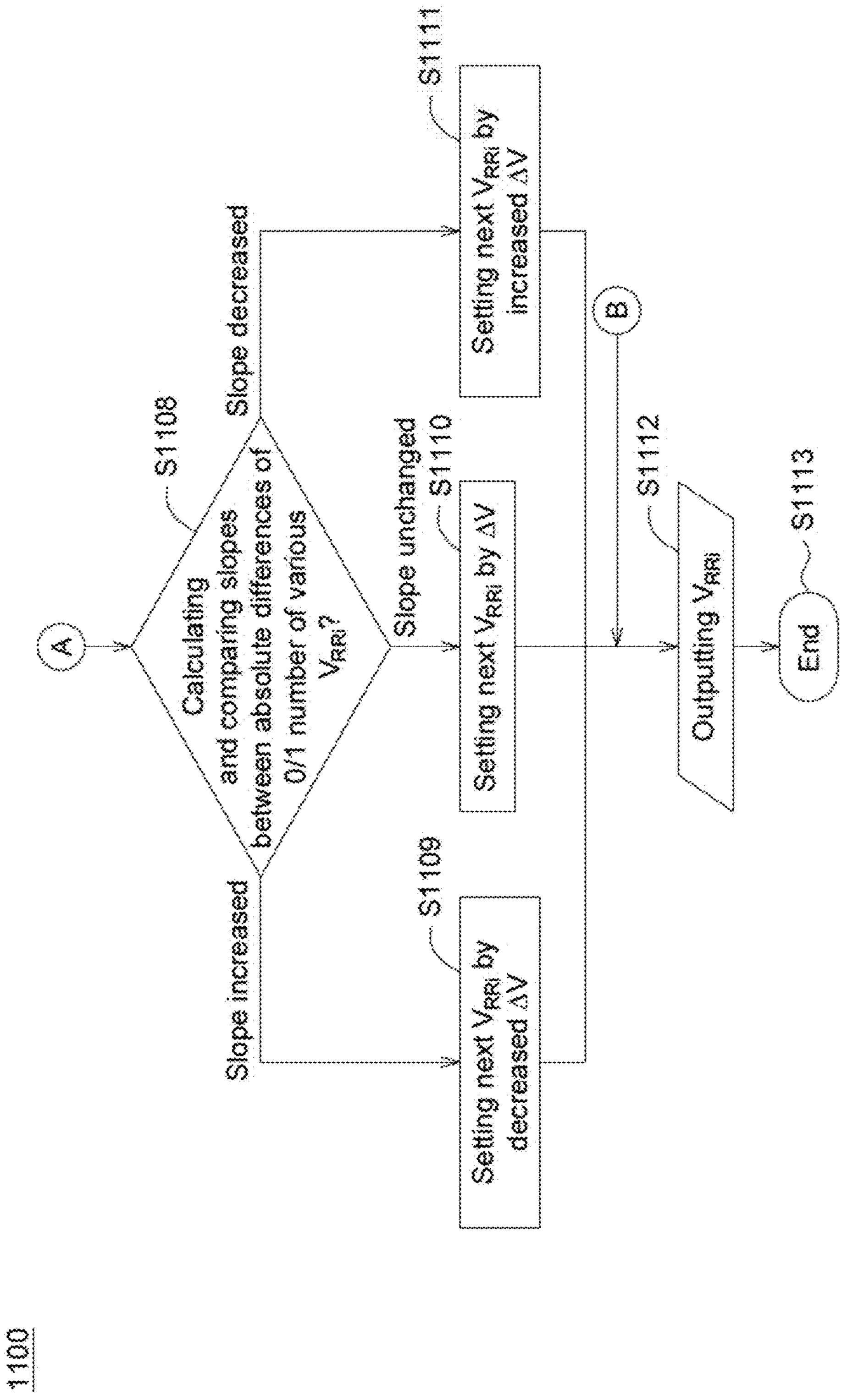

FIGS. 11A and 11B are flow charts of process 1100 of setting retry read voltage with read fail error handling for ECC, according to one or more embodiments of the present disclosure.

Steps S1102 to S1107 are similar to the examples of threshold voltage distribution graphics 1000*a* to 1000*d* above. After starting determining $V_{RRi}$ value (S1101), compares that the absolute difference of bit values 1/0 distribution corresponding to the current $V_{RRi}$ is lower than that of $V_{Read}$ (or precedent $V_{RRi}$) or not (S1102), such as comparing |(1 #)−(0 #)| $V_{Read}$ (or precedent $V_{RRi}$) with |(1 #)−(0 #)|$V_{RRi}$ as above, to determine that the direction set for $V_{RRi}$ is correct (matching the direction to the lower EBC). If the absolute difference of bit values 1/0 distribution corresponding to the current $V_{RRi}$ is greater than that of $V_{Read}$ (or precedent $V_{RRi}$) which fails to read, the next $V_{RRi}$ will be set in opposite direction (S1103), such as the examples of threshold voltage distribution graphics 1000*a* and 1000*d* of FIG. 10. The difference with the examples of FIG. 10 is that $V_{RRi}$ may be retried for several times. Thus, in S1104, determines that "i" is greater than or equal to 2 or not, which can ensure that the retry read is executed at least for 2 times (such as $V_{RR2}$) or not. This is for ensuring that the $V_{RRi}$ set in the opposite direction, will not be identical to the $V_{RRi}$ that is set two times before (For example, in FIG. 13, if $V_{RR4}$ is set in the opposite direction of $V_{RR3}$ by the voltage difference ΔV, $V_{RR4}$ will be identical to $V_{RR2}$). Thus, if "i" is smaller than 2, which means that the is going to be switch at the first time (such as the examples of threshold voltage distribution graphics 1000*a* and 1000*d* of FIG. 10), $V_{RRi}$ will be changed by ΔV according to the setting direction (S1106). If "i" is greater than or equal to 2, $V_{RRi}$ will be changed by decreased ΔV according to the setting direction (S1105), to prevent that next $V_{RRi}$ will be identical to the $V_{RRi}$ that is set two times before. In S1107, the direction of next $V_{RRi}$ is recorded, which the recorded direction can be used for switching direction again, when the absolute difference of bit values 1/0 distribution corresponding to the following $V_{RRi}$ is again greater than that of precedent $V_{RRi}$ which fails to read (such as the example of the threshold voltage distribution graphic 1302 of FIG. 13).

Addition to setting direction of $V_{RRi}$, the adjustment of voltage difference ΔV is also described by steps S1108 to S1111. When the direction for setting $V_{RRi}$ does not need to be changed (determining in S1102), slopes of respective absolute differences between bit values 1/0 distributions obtained between multiple $V_{RRi}$ are calculated and compared in S1108. When slopes of respective absolute differences increase, which also means that the EBC lowering rate is increase, next $V_{RRi}$ will be set by decreased voltage difference ΔV corresponding to increasing slopes (in S1109), to decrease the gap set between multiple $V_{RRi}$ preventing the set $V_{RRi}$ over the position of the "valley" in the graphic (lowest EBC). When slopes of respective absolute differences decrease, which also means that the EBC lowering rate is decrease, next $V_{RRi}$ will be set by increased voltage difference ΔV corresponding to decreasing slopes (in S1111), to increase the gap set between multiple $V_{RRi}$ making the set $V_{RRi}$ closer to the position of the "valley" in the graphic (lowest EBC). When slopes of respective absolute differences stay the same, next $V_{RRi}$ will be set by same voltage difference ΔV (in S1110). Those steps will be described with further details below referring to FIGS. 12 and 13.

Figure 12:
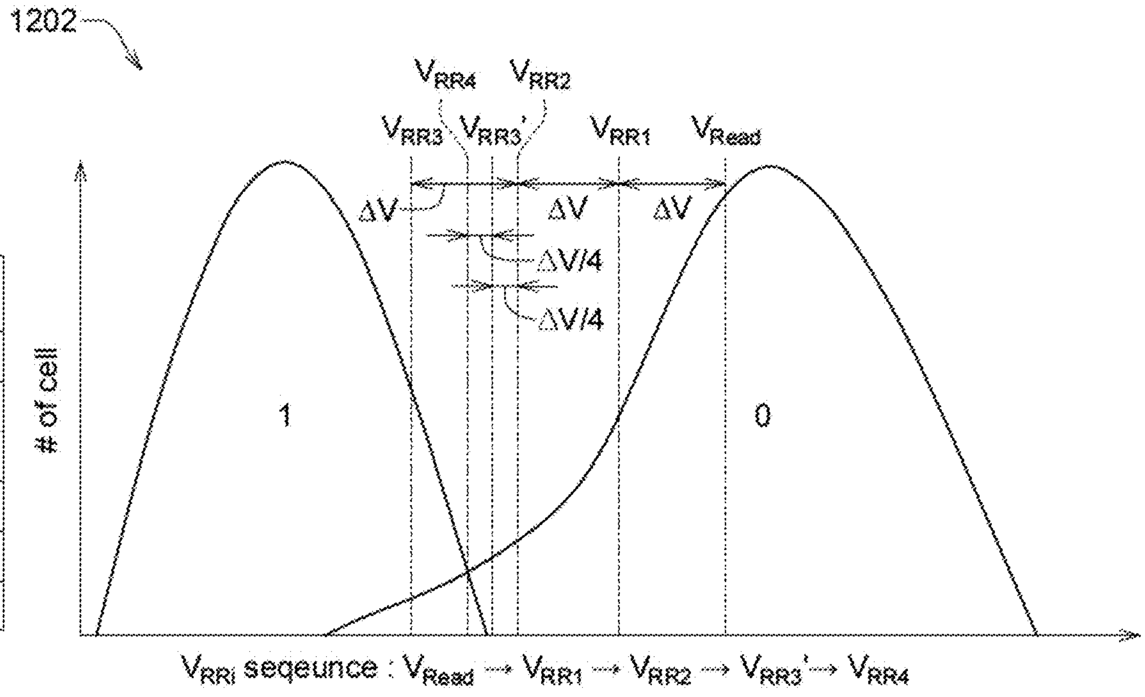
FIGS. 12 and 13 are a schematic diagrams illustrating the threshold voltage distribution of the user data applied with the process of setting retry read voltage of FIGS. 11A and 11B, according to one or more embodiments of the present disclosure.
Figure 13:
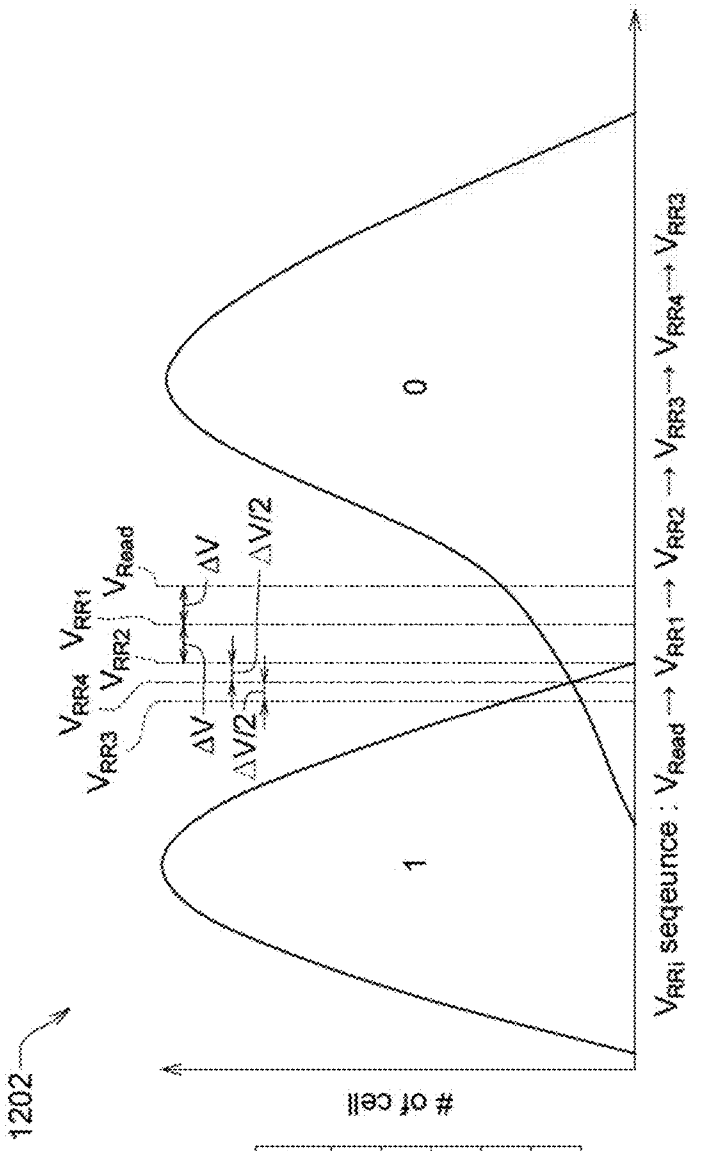

FIGS. 12 and 13 are a schematic diagrams illustrating the threshold voltage distribution (threshold voltage distribution graphics 1202 and 1302) of the user data applied with the process 1100 of setting retry read voltage of FIGS. 11A and 11B, according to one or more embodiments of the present disclosure. In FIG. 12, as shown by table 1201 and the threshold voltage distribution graphic 1202, when $V_{RR2}$ is executed, two sets of variation of slopes of respective absolute differences between bit values 1/0 distributions can be obtained, which are slope variation between $V_{Read}$ and $V_{RR1}$ (1000–800), and slope variation between $V_{RR1}$ and $V_{RR2}$ (800–200). In the meantime, since the slope variation between $V_{RR1}$ and $V_{RR2}$ (600) greater than the slope variation between $V_{Read}$ and $V_{RR1}$ (200), $V_{RR3}$ set by the same voltage difference ΔV will be over the position of the "valley" in the graphic (lowest EBC), as shown in the threshold voltage distribution graphic 1202. Therefore, steps S1108 to S1111 of FIG. 11B can be executed to adjust voltage difference ΔV (adjusted to ΔV/4 in this case), to set $V_{RRi}$ as $V_{RR3}$' instead of $V_{RR3}$, which benefits for finding the retry voltage $V_{RRi}$ closed to the position of the "valley" in the graphic (lowest EBC) to pass ECC decode ($V_{RR4}$ in this case).

In FIG. 13, as shown by table 1301 and the threshold voltage distribution graphic 1302, when $V_{RR3}$ is executed, the absolute difference of bit values 1/0 distributions corresponding to $V_{RR3}$ (500) is greater than that of $V_{RR4}$ (400). Therefore, steps S1103 to S1107 of FIG. 11A can be executed to change the direction of setting $V_{RRi}$, and correspondingly decrease voltage difference ΔV (adjusted to 1V 2 in this case), to set $V_{RRi}$ as $V_{RR4}$ preventing that the voltage value of $V_{RR4}$ is identical to that of $V_{RR2}$, which benefits for finding the retry voltage $V_{RRi}$ closed to the position of the "valley" in the graphic (lowest EBC) to pass ECC decode ($V_{RR4}$ in this case).

Based on examples and implementations above of hard decode, techniques of soft decode is further provided by the present disclosure, to reduce the numbers of retry read and increase the probability of passing ECC decode for retrying reading, which will be described with further details below referring to FIGS. 14 and 15.

Figure 14:
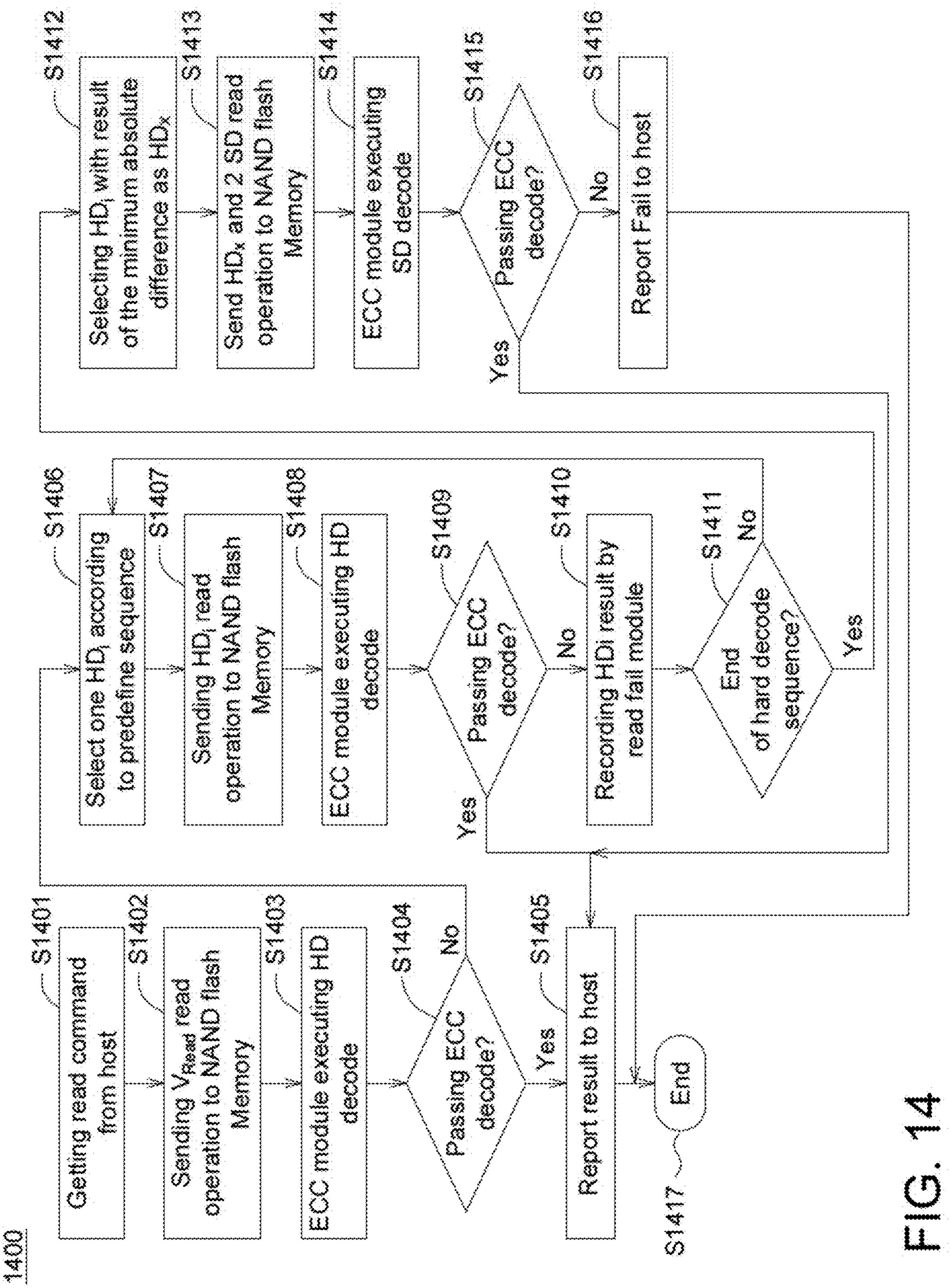
FIG. 14 is a flow chart of SD process for ECC, according to one or more embodiments of the present disclosure.
Figure 15:
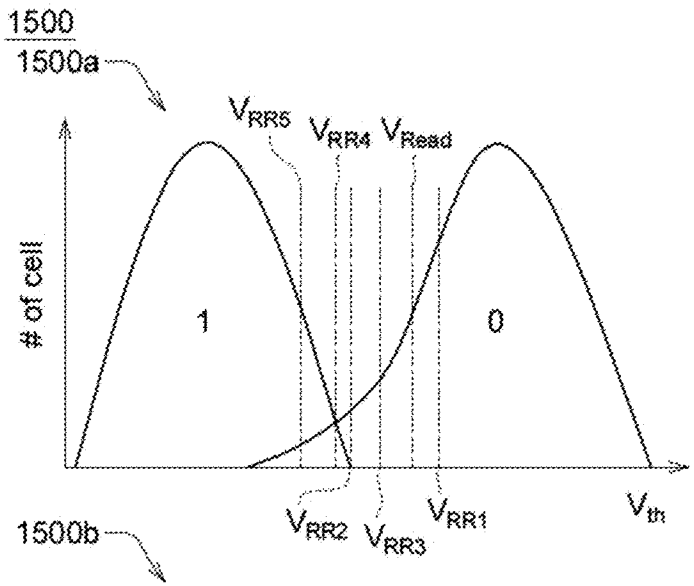
FIG. 15 is a schematic diagram illustrating the threshold voltage distribution of the user data applied with the SD process of FIG. 14, according to one or more embodiments of the present disclosure.

FIG. 14 is a flow chart of SD process 1400 for ECC, according to one or more embodiments of the present disclosure, and FIG. 15 is a schematic diagram illustrating the threshold voltage distribution 1500 of the user data applied with the SD process 1400 of FIG. 14. The difference between the SD process 1400 of FIG. 14 and the SD process 700 of FIG. 7 is that steps, S1401 to S1409, execute the hard decode technique (such as shown by the threshold voltage distribution graphic 1500a and the table 1500b) which is similar to the hard decode technique descripted by FIG. 9 to FIG. 13. $V_{Read}$ of the threshold voltage distribution graphic 1500a can corresponds to $HD_0$ of the table 1500b, and retry read parameters (voltages), $V_{RR1}$, $V_{RR2}$, $V_{RR3}$ and etc., of the table 1500b can sequentially corresponds to $HD_1$, $HD_2$, $HD_3$ and etc., of the predefined retry read table 1501. Thus, after repeatedly executing the hard decode of steps S1401 to S1409, when the levels of hard decode is over (determined in S1411) and the read data still does not pass the ECC decode (such as after executing the level n−1 of the predefined retry read table 1501), the soft decode of steps S1412 to S1414 will be started. Then, $HD_i$ with result of the minimum absolute difference will be selected as $HD_x$ in S1412. In other words, the retry read parameter (voltage) with the minimum absolute difference of bit values 1/0 distributions (the lowest EBC) among the retry read parameters, will be selected as $HD_x$ used for the soft decode ($V_{RR4}$ of the table 1500b in this case), instead of using the predefined voltage value directly (such as $HD_n$ in the predefined retry read table 801 of FIG. 8). In S1413, $HD_x$ and 2 SD read operation ($HD_x$+$SD11_n$+$SD12_n$ in the predefined retry read table 1501 of FIG. 15) are sent to the NAND flash memory. Then, the soft decode will be executed (in S1414), which is similar to the description referring with FIGS. 7 and 8, and is omitted here. Since the absolute difference of bit values 1/0 distributions of selected $HD_x$ was calculated in the hard decode process, which is with the lowest EBC, the soft decode based on the selected $HD_x$ can increase the probability of passing the ECC decode.

According to the embodiments and examples above, the techniques provided by the present disclosure can dynamically adjust next retry read voltage and voltage difference between retry read voltages based on the absolute difference between numbers of the first bit value/the second bit value (bit values 1/0). Furthermore, after preset levels of hard decoding, the recorded hard decode retry read voltage with the absolute difference of bit values 1/0 distributions can be used to execute soft decode, which can reduce the numbers of retrying reading and increase the probability of data with error bit passing the ECC decode, to improve the performance of read operation in the memory device.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An operation method for retrying reading data in a memory device, the operation method comprising:

applying a first read voltage to the memory device and calculating a first absolute difference between the number of a first bit value and the number of a second bit value corresponding to the first read voltage;

applying a second read voltage to the memory device and calculating a second absolute difference between the number of the first bit value and the number of the second bit value corresponding to the second read voltage, which a first voltage difference is between the second read voltage and the first read voltage along a first direction; and comparing the first absolute difference and the second absolute difference;

wherein, upon determining the second absolute difference is smaller than the first absolute difference, obtaining at least one retry read voltages by subsequently adding an amount of the first voltage difference on the second read voltage along the first direction, and applying the at least one retry read voltages to the memory device until a read data obtained by one of the retry read voltages passing an ECC decoding;

wherein, upon determining the second absolute difference is greater than the first absolute difference, obtaining at least one retry read voltages by subsequently subtracting the amount of the first voltage difference from the first read voltage along a second direction which is opposite to the first direction, and applying the at least one retry read voltages to the memory device until a read data obtained by one of the retry read voltages passing the ECC decoding.

2. The operation method of claim 1, wherein, during obtaining the at least one retry read voltages by subsequently adding the amount of the first voltage difference on the second read voltage along the first direction, calculates at least two absolute differences between the number of the first bit value and the number of the second bit value obtained between the at least one retry read voltages, wherein upon determining the at least two absolute differences increase, a second voltage difference is sequentially subtracted from a precedent retry read voltage of the retry read voltages along the second direction for decreasing voltage to obtain and apply a next retry read voltage of the retry read voltages until a read data obtained by one of the retry read voltages passing the ECC decoding, wherein the second voltage difference is smaller than the first voltage difference.

3. The operation method of claim 1, wherein, during obtaining the at least one retry read voltages by subsequently subtracting the amount of the first voltage difference from the first read voltage along the second direction, calculates at least two absolute differences between the number of the first bit value and the number of the second bit value obtained between the at least one retry read voltages, wherein upon determining the at least two absolute differences increase, a second voltage difference is sequentially added on a precedent retry read voltage of the retry read voltages along the first direction for increasing voltage to obtain and apply a next retry read voltage until a read data obtained by one of the retry read voltages passing the ECC decoding, wherein the second voltage step is smaller than the first voltage.

4. The operation method of claim 3, wherein the second voltage difference is one third or one fourth of the first voltage difference.

5. The operation method of claim 1, wherein, during obtaining the at least one retry read voltages by subsequently adding the amount of the first voltage difference on the second read voltage along the first direction, calculates slopes of respective absolute differences between the number of the first bit value and the number of the second bit value obtained between the retry read voltages, wherein upon determining the slopes of the respective absolute differences decrease, a third voltage difference is sequentially added on a precedent retry read voltage along the first direction for reading the memory device, wherein upon determining the slopes of the respective absolute differences increase, a fourth voltage difference is sequentially added on a precedent retry read voltage of the retry read voltages along the first direction for increasing voltage to obtain and apply a next retry read voltage for reading the memory device, wherein the third voltage difference is greater than the first voltage, and the fourth voltage difference is smaller than the first voltage difference.

6. The operation method of claim 1, wherein, during obtaining the at least one retry read voltages by subsequently subtracting the amount of the first voltage difference from the first read voltage along the second direction, calculates slopes of respective absolute differences between the number of the first bit value and the number of the second bit value obtained between the retry read voltages, wherein upon determining the slopes of the respective absolute differences decrease, a third voltage difference is sequentially subtracted from a precedent retry read voltage along the second direction for reading the memory device, wherein upon determining the slopes of the respective absolute differences increase, a fourth voltage difference is sequentially subtracted from a precedent retry read voltage of the retry read voltages along the first direction for decreasing voltage to obtain and apply a next retry read voltage for reading the memory device, wherein the third voltage difference is greater than the first voltage, and the fourth voltage difference is smaller than the first voltage difference.

7. The operation method of claim 6, wherein an absolute voltage difference between the first voltage difference and the third voltage difference or the fourth voltage difference is corresponding to the variation of the slopes of the respective absolute differences.

8. An operation method for retrying reading data in a memory device, the operation method comprising:

executing a read operation to read the memory device, the read operation comprising the following steps:

applying a first HD (hard decode) read voltage to the memory device and calculating a first absolute difference between the number of a first bit value and the number of a second bit value corresponding to the first HD read voltage;

applying a second HD read voltage to the memory device and calculating a second absolute difference between the number of the first bit value and the number of the second bit value corresponding to the second HD read voltage, which a first voltage difference is between the second HD read voltage and the first HD read voltage along a first direction; and comparing the first absolute difference and the second absolute difference, wherein, upon determining the second absolute difference is smaller than the first absolute difference, obtaining at least one HD read voltages by subsequently adding an amount of the first voltage difference on the second HD voltage along the first direction, and applying the at least one HD read voltages to the memory device for the read operation based on preset levels, wherein, upon determining the second absolute difference is greater than the first absolute difference, obtaining at least one HD read voltages by subsequently subtracting the amount of the first voltage difference from the first HD voltage along a second direction which is opposite to the first direction, and applying the at least one HD read voltages to the memory device for the read operation based on the preset levels;

wherein upon determining read data still fails to pass an ECC decode after completing the preset levels of the read operation, executes a SD (soft decode) operation for reading the memory device, the SD operation comprising the following steps:

using a HD read voltage corresponding to the minimum absolute difference between the number of the first bit value and the number of the second bit value, among the at least one HD read voltages, as a first SD read voltage;

generating a second SD read voltage and a third SD read voltage based on the first SD read voltage;

calculating LLRs (Log-likelihood ration) based on the first SD read voltage, the second SD read voltage and the third SD read voltage, and executing soft decoding; and repeating the steps of the SD operation until the read data passing the ECC decode.

9. The operation method of claim 8, wherein, during obtaining the at least one HD read voltages by subsequently adding the amount of the first voltage difference on the second HD voltage along the first direction for the read operation based on the preset levels, calculates at least two absolute differences between the number of the first bit value and the number of the second bit value obtained between the at least one HD read voltages, wherein upon determining the at least two absolute differences increase, a second voltage difference is sequentially subtracted from a precedent HD read voltage along the second direction for reading the memory device, wherein the second voltage difference is smaller than the first voltage difference.

10. The operation method of claim 8, wherein, during obtaining the at least one HD read voltages by subsequently subtracting the amount of the first voltage difference from the first HD voltage along a second direction for the read operation based on the preset levels, calculates at least two absolute differences between the number of the first bit value and the number of the second bit value obtained between the at least one HD read voltages, wherein upon determining the at least two absolute differences increase, a second voltage difference is sequentially added on a precedent HD read voltage along the first direction for reading the memory device, wherein the second voltage step is smaller than the first voltage.

11. The operation method of claim 10, wherein the second voltage difference is one third or one fourth of the first voltage difference.

12. The operation method of claim 8, wherein, during obtaining the at least one HD read voltages by subsequently adding the amount of the first voltage difference on the second HD voltage along the first direction for the read operation based on the preset levels, calculates slopes of respective absolute differences between the number of the first bit value and the number of the second bit value obtained between the at least one HD read voltages, wherein upon determining the slopes of the respective absolute differences decrease, a third voltage difference is sequentially added on a precedent HD read voltage along the first direction for reading the memory device, wherein upon determining the slopes of the respective absolute differences increase, a fourth voltage difference is sequentially added on a precedent HD read voltage along the first direction for reading the memory device, wherein the third voltage difference is greater than the first voltage, and the fourth voltage difference is smaller than the first voltage difference.

13. The operation method of claim 8, wherein, during obtaining the at least one HD read voltages by subsequently subtracting the amount of the first voltage difference from the first HD voltage along a second direction for the read operation based on the preset levels, calculates slopes of respective absolute differences between the number of the first bit value and the number of the second bit value obtained between the at least one HD read voltages, wherein upon determining the slopes of the respective absolute differences decrease, a third voltage difference is sequentially subtracted from a precedent HD read voltage along the second direction for reading the memory device, wherein upon determining the slopes of the respective absolute differences increase, a fourth voltage difference is sequentially subtracted from a precedent HD read voltage along the first direction for reading the memory device, wherein the third voltage difference is greater than the first voltage, and the fourth voltage difference is smaller than the first voltage difference.

14. The operation method of claim 13, wherein an absolute voltage difference between the first voltage difference and the third voltage difference or the fourth voltage difference is corresponding to the variation of the slopes of the respective absolute differences.

15. A memory device, comprising:

a memory array; and a controller, coupled to the memory array, the controller comprising:

a CPU;

an ECC (error correction code) module, coupled to the CPU; and a read fail module, coupled to the CPU and the ECC module, wherein the controller executes a read operation for reading the memory device, which comprises the following procedures:

the controller applies a first HD (hard decode) read voltage to the memory array for reading data, and the read fail module calculates a first absolute difference between the number of a first bit value and the number of a second bit value corresponding to the first HD read voltage while the read data failing to pass an ECC decode of the ECC module;

the controller applies a second HD read voltage to the memory array, and the read fail module calculates a second absolute difference between the number of the first bit value and the number of the second bit value corresponding to the second HD read voltage while the read data failing to pass the ECC decode of the ECC module, which a first voltage difference is between the second HD read voltage and the first HD read voltage along a first direction; and the CPU compares the first absolute difference and the second absolute difference, wherein, upon determining the second absolute difference is smaller than the first absolute difference, the first voltage difference is sequentially added on the second HD read voltage by the controller, to respectively generate at least one HD read voltages along the first direction for the read operation for reading the memory array based on preset levels, until the read data passing the ECC decode of the ECC module, wherein, upon determining the second absolute difference is greater than the first absolute difference, the first voltage difference is sequentially subtracted from the first HD read voltage by the controller, to respectively generate at least one HD read voltages along a second direction which is opposite to the first direction, for reading the memory array based on the preset levels, until the read data passing the ECC decode of the ECC module.

16. The memory device of claim 15, wherein upon determining read data still fails to pass the ECC decode of the ECC module after completing the preset levels of the read operation, the controller executes a SD (soft decode) operation for reading the memory array, the SD operation comprising the following procedures:

the CPU using a HD read voltage corresponding to the minimum absolute difference between the number of the first bit value and the number of the second bit value, among the at least one HD read voltages recorded by the read fail module, as a first SD read voltage;

the CPU generating a second SD read voltage and a third SD read voltage based on the first SD read voltage;

the ECC module calculating LLRs (Log-likelihood ration) based on the first SD read voltage, the second SD read voltage and the third SD read voltage, and executing soft decoding; and the controller repeating the procedures of the SD operation until the read data passing the ECC decode.

17. The memory device of claim 16, wherein, during the first voltage difference sequentially subtracted from the first HD read voltage along the second direction by the controller for reading the memory array based on the preset levels, the read fail module calculates slopes of respective absolute differences between the number of the first bit value and the number of the second bit value obtained between the at least one HD read voltages, wherein upon determining the slopes of the respective absolute differences decrease, a third voltage difference is sequentially subtracted from a precedent HD read voltage along the second direction by the controller for reading the memory array, wherein upon determining the slopes of the respective absolute differences increase, a fourth voltage difference is sequentially subtracted from a precedent HD read voltage along the first direction by the controller for reading the memory array, wherein the third voltage difference is greater than the first voltage, and the fourth voltage difference is smaller than the first voltage difference, and wherein an absolute voltage difference between the first voltage difference and the third voltage difference or the fourth voltage difference is corresponding to the variation of the slopes of the respective absolute differences.

18. The memory device of claim 15, wherein, during the first voltage difference sequentially added on the second HD read voltage along the first direction by the controller, for reading the memory array based on the preset levels, the read fail module calculates at least two absolute differences between the number of the first bit value and the number of the second bit value obtained between the at least one HD read voltages, wherein upon determining the at least two absolute differences increase, a second voltage difference is sequentially subtracted from a precedent HD read voltage along the second direction by the controller for reading the memory array, wherein the second voltage difference is smaller than the first voltage difference.

19. The memory device of claim 15, wherein, during the first voltage difference sequentially subtracted from the first HD read voltage along the second direction by the controller, for reading the memory array based on the preset levels, the read fail module calculates at least two absolute differences between the number of the first bit value and the number of the second bit value obtained between the at least one HD read voltages, wherein upon determining the at least two absolute differences increase, a second voltage difference is sequentially added on a precedent HD read voltage along the first direction by the controller for reading the memory array, wherein the second voltage step is smaller than the first voltage.

20. The memory device of claim 15, during the first voltage difference sequentially added on the second HD read voltage along the first direction by the controller, for reading the memory array based on the preset levels, the read fail module calculates slopes of respective absolute differences between the number of the first bit value and the number of the second bit value obtained between the at least one HD read voltages, wherein upon determining the slopes of the respective absolute differences decrease, a third voltage difference is sequentially added on a precedent HD read voltage along the first direction by the controller for reading the memory array, wherein upon determining the slopes of the respective absolute differences increase, a fourth voltage difference is sequentially added on a precedent HD read voltage along the first direction by the controller for reading the memory array, wherein the third voltage difference is greater than the first voltage, and the fourth voltage difference is smaller than the first voltage difference, and wherein an absolute voltage difference between the first voltage difference and the third voltage difference or the fourth voltage difference is corresponding to the variation of the slopes of the respective absolute differences.

* * * * *